(12) United States Patent
Hayase et al.

(10) Patent No.: US 7,012,657 B2
(45) Date of Patent: Mar. 14, 2006

(54) METHOD OF FABRICATING LIQUID CRYSTAL DISPLAY DEVICE

(75) Inventors: Takasuke Hayase, Izumi (JP); Keiko Yamada, Izumi (JP); Masami Yamashita, Izumi (JP); Shinichi Nakata, Izumi (JP); Akitoshi Maeda, Izumi (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 37 days.

(21) Appl. No.: 10/692,736

(22) Filed: Oct. 27, 2003

(65) Prior Publication Data

US 2004/0085489 A1    May 6, 2004

(30) Foreign Application Priority Data

Oct. 25, 2002 (JP) ............................. 2002-311526
Oct. 22, 2003 (JP) ............................. 2003-362206

(51) Int. Cl.
*G02F 1/136* (2006.01)
*G02F 1/13* (2006.01)

(52) U.S. Cl. ....................................... 349/43; 349/187
(58) Field of Classification Search ................. 349/43, 349/187
See application file for complete search history.

(56) References Cited

U.S. PATENT DOCUMENTS 6,912,035 B1 * 6/2005 Kaneko et al. ............. 349/147

2002/0016075 A1 * 2/2002 Peng et al. ................. 438/700

FOREIGN PATENT DOCUMENTS

| JP | 6-88973 | 3/1994 |
| JP | 9-246210 | 9/1997 |
| JP | 9-258247 | 10/1997 |
| JP | 9-293875 | 11/1997 |
| JP | 10-161158 | 6/1998 |
| JP | 11-95239 | 4/1999 |
| JP | 2001-343901 | 12/2001 |
| JP | 2001-345023 | 12/2001 |
| JP | 2001-345024 | 12/2001 |
| JP | 2002-296609 | 10/2002 |

* cited by examiner

*Primary Examiner*—Toan Ton

(74) *Attorney, Agent, or Firm*—Young & Thompson

(57) ABSTRACT

The method of fabricating a liquid crystal display device includes the steps of (a) fabricating a switching device on a substrate, (b) forming an interlayer insulating film on the substrate such that the switching device is covered with the interlayer insulating film, and (c) forming a transparent electrode on the interlayer insulating film, the transparent electrode being electrically connected to the switching device through the interlayer insulating film, the step (c) including (c1) depositing electrically conductive, transparent and amorphous material on the interlayer insulating film, (c2) patterning the material into the transparent electrode, and (c3) turning the transparent electrode into polysilicon by thermal annealing carried out after formation of an alignment film.

8 Claims, 16 Drawing Sheets 1 1 (2 3)　　1 3

1 1　1 3　　　　1 3

METHOD OF FABRICATING LIQUID CRYSTAL DISPLAY DEVICE

BACKGROUND OF THE INVENTION

1. Field of the Invention

The invention relates to a method of fabricating a liquid crystal display device, and more particularly to such a method including the step of forming an electrically conductive transparent film in a predetermined pattern on an interlayer insulating film comprised of an electrically insulating organic film.

2. Description of the Related Art

A liquid crystal display device is grouped into a light-transmission type one, a light-reflection type one and a combination type one in dependence on a light source.

A light-transmission type liquid crystal display device is designed to include a back-light device as a light source for displaying images. A light-reflection type liquid crystal display device is designed to include a light-reflector, at which incident light is reflected towards a viewer. Hence, a light-reflection type liquid crystal display device is not necessary to have a back-light device as a light source unlike a light-transmission type liquid crystal display device. A combination type liquid crystal display device is designed to have the same structure as that of a light-transmission type liquid crystal display device for a half of a display area and further have the same structure as that of a light-reflection type liquid crystal display device for the rest of a display area.

Among the above-mentioned three type liquid crystal display devices, a light-transmission liquid crystal display device is usually designed to include a thin film transistor (TFT) or a metal-insulator-metal (MIM) as a switching device for driving and controlling a pixel electrode. A pixel electrode is usually comprised of an electrically conductive transparent film such as an indium-tin oxide (ITO) film for ensuring high light-transmissivity and low resistance.

Many methods have been suggested for patterning indium-tin oxide (ITO) into a pixel electrode.

For instance, Japanese Patent Application Publication No. 6-88973 has suggested a method of patterning ITO into a pixel electrode, including the steps of depositing indium-tin oxide on an inorganic interlay insulating film by sputtering at 0 to 100 degrees centigrade, patterning the deposited indium-tin oxide into a pixel electrode, and annealing the pixel electrode at 200 to 400 degrees centigrade, preferably at 230 to 380 degrees centigrade, in hydrogen atmosphere. It is said in the Publication that annealing for reducing dangling bond in a semiconductor layer of a thin film transistor and further for enhancing electrical characteristics and annealing for light-transmissivity of ITO and further for reducing electrical resistivity of ITO can be carried out as single annealing.

Japanese Patent Application Publication No. 9-258247 has suggested a method of patterning ITO into a pixel electrode on an electrically insulating organic film such as an acrylic resin film, including the steps of depositing indium-tin oxide on an electrically insulating organic film composed of acrylic resin by sputtering at about 230 degrees centigrade, annealing the indium-tin oxide immediately after the deposition of the indium-tin oxide at a temperature equal to or greater than 100 degrees centigrade but equal to or smaller than a temperature at which the indium-tin oxide was deposited, and patterning the indium-tin oxide into a pixel electrode. It is said in the Publication that it is possible to reduce a line-width shift in the step of patterning ITO by carrying out annealing after deposition of ITO.

If an interlayer insulating film comprised of an electrically insulating organic film is annealed at 230 degrees centigrade or higher as suggested in the above-mentioned Japanese Patent Application Publication No. 6-88973, the electrically insulating organic film would be usually decomposed, resulting in reduction in light-transmissivity. Hence, annealing for reducing dangling bond in a semiconductor layer of a thin film transistor and enhancing electric characteristics of the same is usually carried out prior to formation of an electrically insulating organic film independently of annealing to be carried out after deposition of indium-tin oxide.

Japanese Patent Application Publication No. 2001-343901 has suggested a method of patterning indium-tin oxide both on an electrically insulating organic film such as an acrylic resin film and an electrically insulating inorganic film such as a SiN film. The suggested method includes the steps of depositing indium-tin oxide on both on an electrically insulating organic film and an electrically insulating inorganic film, annealing the indium-tin oxide at 150 to 220 degrees centigrade, preferably at 200 to 220 degrees centigrade, and patterning the indium-tin oxide to a pixel electrode subsequently to the annealing step.

Japanese Patent Application Publications Nos. 2001-345023 and 2001-345024 suggest a method of patterning ITO into a pixel electrode, including the steps of depositing indium-tin oxide on an electrically insulating organic film, applying $O_2$, Ar or $CF_4$ plasma to the indium-tin oxide such that the indium-tin oxide has a crystal diameter in the range of 20 nm to 50 nm, and patterning the indium-tin oxide into a pixel electrode. It is said in the Publications that by carrying out annealing after patterning indium-tin oxide into a pixel electrode or applying plasma to indium-tin oxide before patterning the indium-tin oxide into a pixel electrode, indium-tin oxide deposited on an electrically insulating organic film and indium-tin oxide deposited on an electrically insulating inorganic film would have etching rates almost equal to each other, resulting in that a line-width shift can be reduced in the step of patterning ITO into a pixel electrode. It is further said in Japanese Patent Application Publication No. 2001-345023 that the indium-tin oxide may be annealed at 150 to 220 degrees centigrade after the step of patterning the indium-tin oxide into a pixel electrode.

Japanese Patent Application Publication No. 10-161158 has suggested a method of patterning indium-tin oxide into a pixel electrode on an electrically insulating organic film such as a poly-imide resin film or an acrylic resin film. The suggested method includes the step of roughing a surface of an electrically insulating organic film by sputtering etching, dry etching or irradiation of ultra-violet rays before carrying out a step of patterning ITO into a pixel electrode. By carrying out the step of roughing the surface, ITO and the electrically insulating organic film would make contact with each other through a large area, which ensures close contact between ITO and the electrically insulating organic film. As a result, it would be possible to accurately pattern ITO into a pixel electrode. The step of roughing the surface may be carried out prior to or subsequently to formation of a contact hole.

If indium-tin oxide is patterned into a pixel electrode on an electrically insulating organic film such as a acrylic resin film in accordance with the method suggested in Japanese Patent Application Publication No. 6-88973, the electrically insulating organic film would be decomposed, resulting in that the resultant pixel electrode would be colored, and hence, light-transmissivity would be reduced, because a temperature at which the indium-tin oxide is annealed is usually higher than a temperature at which an electrically insulating organic film is not decomposed. If an electrically insulating organic film is annealed at 200 to 300 degrees centigrade, it would be possible to prevent the electrically insulating organic film from being decomposed, but a range of 200 to 300 degrees centigrade is too low to reduce dangling bond in a semiconductor layer of a thin film transistor. Accordingly, it is impossible to design the method to include only one annealing step.

In accordance with the method suggested in Japanese Patent Application Publication No. 9-258247, an indium-tin oxide film is reformed by gas discharged from an electrically insulating organic film during patterning indium-tin oxide into a pixel electrode, resulting etching residue in the step of patterning indium-tin oxide into a pixel electrode. If indium-tin oxide is deposited at 100 degrees centigrade or lower, such etching residue can be suppressed to some degree, but it is not possible to completely suppress such etching residue. Since the method includes a step of carrying out annealing after deposition of indium-tin oxide, the method unavoidably carries out an annealing step twice.

In the methods suggested in the above-mentioned Japanese Patent Application Publications Nos. 2001-345023 and 345024, plasma is applied to indium-tin oxide before patterning the indium-tin oxide into a pixel electrode, namely, after formation of a contact hole throughout the electrically insulating organic film. According to the experiments having been conducted by the inventors, it was found out that contact resistance between the indium-tin oxide and an underlying metal film was increased in dependence on gas used for generating plasma. In particular, such contact resistance is significantly increased when fluorine-containing gas such as $CF_4$ or helium (He) gas is used for generating plasma.

In the method suggested in the above-mentioned Japanese Patent Application Publication No. 10-161158, if ultra-violet rays are first irradiated to the electrically insulating organic film, the electrically insulating organic film would be decomposed, resulting in that the resultant pixel electrode would be colored.

In addition, if sputter etching or dry etching is to be carried out prior to formation of a contact hole, it would be possible to do so after baking an electrically insulating organic film, only if the electrically insulating organic film is not photo-sensitive. In contrast, if the electrically insulating organic film is photo-sensitive, it would be necessary to carry out sputter etching or dry etching after the electrically insulating organic film was formed. By carrying out sputter etching or dry etching in a condition in which the electrically insulating organic film has been already formed, an etching apparatus might be contaminated with the result of significant reduction in productivity, and a roughened surface of the electrically insulating organic film would be planarized during baking the electrically insulating organic film.

If sputter etching or dry etching is carried out after formation of a contact hole, there is caused a problem that the above-mentioned contact resistance is increased.

Increase in a contact resistance might cause horizontal cross-talk and/or non-uniformity of horizontal lines in a common-storage type twisted nematic liquid crystal display device or an in-plane switching type liquid crystal display device. Specifically, it is necessary in a common-storage type twisted nematic liquid crystal display device to bind common lines to one another for applying a common voltage to the common lines. However, if a thin film transistor is designed to have a structure in which common lines are bound to one another through an indium-tin oxide film formed on an interlayer insulating film, a contact resistance would be increased due to an electrically insulating organic film, and hence, the common lines would unavoidably have a high resistance.

Recently, an in-plane switching type liquid crystal display device is commercially available. An in-plane switching type liquid crystal display device includes a common electrode comprised of an electrically conductive transparent film and formed on an electrically insulating organic interlayer film above a signal line, and a pixel electrode comprised of the electrically conductive transparent film of which the common electrode is comprised, and formed in facing relation to the common electrode. Such an in-plane switching type liquid crystal display device has a high aperture ratio. For instance, an in-plane switching type liquid crystal display device is suggested in WO98/47044.

It is quite important for an in-plane switching type liquid crystal display device to accurately pattern an electrically conductive transparent film formed on an electrically insulating organic film, into a pixel electrode uniformly within a substrate. If process control for a step of patterning an electrically conductive transparent film into a pixel electrode is insufficient, there would be resulted in non-uniformity in displayed images. In addition, it is important for a common storage type in-plane switching type liquid crystal display device to reduce a contact resistance between an electrically conductive transparent film and an underlying metal film.

Thus, there is a need for a method of fabricating a liquid crystal display device which method is capable of enhancing accuracy with which an electrically conductive transparent film formed on an electrically insulating organic interlayer film is patterned into a pixel electrode, and accomplishing a low contact resistance between the electrically conductive transparent film and an underlying metal film.

Japanese Patent Application Publication No. 9-246210 has suggested a method of patterning an electrically conductive transparent film, including the steps of forming an electrically conductive transparent film on an organic or inorganic substrate or film, forming a mask on the electrically conductive transparent film in a predetermined pattern, implanting hydrogen ions into the electrically conductive transparent film through the mask, and etching for removal portions of the electrically conductive transparent film into which the hydrogen ions were implanted.

Japanese Patent Application Publication No. 9-293875 has suggested a method of fabricating a semiconductor device, including the steps of forming a light-permeable film on a monocrystal semiconductor substrate, fabricating a non-monocrystal semiconductor device on the light-permeable film, fabricating a monocrystal semiconductor device on the monocrystal semiconductor substrate, forming an electrically conductive amorphous film on the monocrystal semiconductor substrate, and re-crystallizing the electrically conductive amorphous film to make the film transparent.

Japanese Patent Application Publication No. 11-95239 has suggested a method of fabricating a liquid crystal display device, including the step of forming an indium-tin oxide film on an electrically insulating substrate by sputtering in which there is used water vapor having a partial pressure in the range of 0.002 Pa to 0.010 Pa.

Japanese Patent Application Publication No. 2002-296609 has suggested a method of fabricating a liquid crystal display device including a bus wire arranged on a substrate in a matrix, a switching device electrically connected to the bus wire, and a pixel electrode electrically connected to the bus wire with an interlayer insulating film being sandwiched therebetween, the method including the step of keeping the substrate at 100 to 170 degrees centigrade while an electrically conductive transparent film is formed on the interlayer insulating film.

SUMMARY OF THE INVENTION

In view of the above-mentioned problems in the conventional methods, it is an object of the present invention to provide a method of fabricating a liquid crystal display device which method is capable of forming a contact hole throughout an electrically insulating organic or inorganic interlayer film and accurately patterning an electrically conductive transparent film into a pixel electrode uniformly within a substrate without etching residue of the electrically conductive transparent film, and further of preventing a contact resistance between the electrically conductive transparent film and an underlying metal film from increasing, ensuring no poor quality in displayed images.

In one aspect of the present invention, there is provided a method of fabricating a liquid crystal display device, including the steps of (a) fabricating a switching device on a substrate, (b) forming an interlayer insulating film on the substrate such that the switching device is covered with the interlayer insulating film, and (c) forming a transparent electrode on the interlayer insulating film, the transparent electrode being electrically connected to the switching device through the interlayer insulating film, the step (c) including (c1) depositing electrically conductive, transparent and amorphous material on the interlayer insulating film, (c2) patterning the material into the transparent electrode, and (c3) turning the transparent electrode into polysilicon by thermal annealing carried out after formation of an alignment film.

For instance, the step (b) may include the steps of (b1) forming an electrically insulating inorganic film on the substrate such that the switching device is covered with the electrically insulating inorganic film, and (b2) forming an electrically insulating organic film on the electrically insulating inorganic film.

It is preferable that the electrically insulating organic film is formed covering therewith at least partially at least a signal line including a drain electrode of the switching device, in the step (b2).

For instance, the step (a) may include the steps of (a1) forming both a scanning line including a gate electrode of the switching device and a common line through which a common voltage is applied, on the substrate, (a2) forming a gate insulating film on the substrate such that the scanning line and the common line are covered with the gate insulating film, (a3) forming a semiconductor layer on the gate insulating film, the semiconductor layer acting as an active layer of the switching device, and (a4) forming both a signal line including a drain electrode of the switching device and a source electrode of the switching device, the signal line intersecting with the scanning line, and the step (c) may include the step of patterning the electrically conductive, transparent and amorphous material into a pixel electrode and a common electrode on the interlayer insulating film, the pixel electrode being in electrical connection with the switching device, the common electrode being in electrical connection with the common line.

It is preferable that the material is indium-tin oxide (ITO).

It is preferable that the material is deposited on the interlayer insulating film in the step (c1) at room temperature (RM).

It is preferable that the material is deposited on the interlayer insulating film in the step (c1) in atmosphere including at least moisture or hydrogen.

It is preferable that the thermal annealing is carried out in the step (c3) in the range of 180 to 240 degrees centigrade both inclusive.

There is further provided a method of fabricating a liquid crystal display device, including the steps of (a) fabricating a switching device on a substrate, (b) forming an interlayer insulating film on the substrate such that the switching device is covered with the interlayer insulating film, the interlayer insulating film being comprised of an electrically insulating inorganic film and an electrically insulating organic film formed on the electrically insulating inorganic film, and (c) forming a transparent electrode on the interlayer insulating film, the transparent electrode being electrically connected to the switching device through the interlayer insulating film, the step (c) including (c1) patterning the electrically insulating organic film, (c2) applying plasma to the substrate including the electrically insulating organic film, (c3) forming a contact hole throughout the electrically insulating inorganic film, (c4) depositing electrically conductive transparent material on the interlayer insulating film, and (c5) patterning the material into the transparent electrode.

It is preferable that the electrically insulating organic film is formed covering therewith at least partially at least a signal line including a drain electrode of the switching device, in the step (c1).

For instance, the step (a) may include the steps of (a1) forming both a scanning line including a gate electrode of the switching device and a common line through which a common voltage is applied, on the substrate, (a2) forming a gate insulating film on the substrate such that the scanning line and the common line are covered with the gate insulating film, (a3) forming a semiconductor layer on the gate insulating film, the semiconductor layer acting as an active layer of the switching device, and (a4) forming both a signal line including a drain electrode of the switching device and a source electrode of the switching device, the signal line intersecting with the scanning line, and the step (c5) may include the step of patterning the electrically conductive transparent material into a pixel electrode and a common electrode on the interlayer insulating film, the pixel electrode being in electrical connection with the switching device, the common electrode being in electrical connection with the common line.

It is preferable that the plasma is helium (He) plasma.

For instance, the step (c3) may include (c3-1) forming a photoresist on the interlayer insulating film in a predetermined pattern, (c3-2) post-baking the photoresist, and (c3-3) etching the electrically insulating inorganic film with the photoresist being used as a mask by wet-etching or both wet- and dry-etching.

It is preferable that the electrically conductive transparent material is indium-tin oxide (ITO) or indium-zinc oxide (IZO).

There is still further provided a method of fabricating a liquid crystal display device, including the steps of (a) fabricating a switching device on a substrate, (b) forming an interlayer insulating film on the substrate such that the switching device is covered with the interlayer insulating film, the interlayer insulating film being comprised of an electrically insulating inorganic film and an electrically insulating organic film formed on the electrically insulating inorganic film, and (c) forming a transparent electrode on the interlayer insulating film, the transparent electrode being electrically connected to the switching device through the interlayer insulating film, the step (c) including (c1) patterning the electrically insulating organic film, (c2) forming a contact hole throughout the electrically insulating inorganic film, (c3) depositing electrically conductive transparent material on the interlayer insulating film, and (c4) patterning the material into the transparent electrode, the step (c2) including (c2-1) forming a photoresist on the interlayer insulating film in a predetermined pattern, and (c2-2) applying dry-etching to the electrically insulating inorganic film with the photoresist being used as a mask without post-baking the photoresist.

It is preferable that the electrically insulating organic film is formed covering therewith at least partially at least a signal line including a drain electrode of the switching device, in the step (c1).

For instance, the step (a) may include the steps of (a1) forming both a scanning line including a gate electrode of the switching device and a common line through which a common voltage is applied, on the substrate, (a2) forming a gate insulating film on the substrate such that the scanning line and the common line are covered with the gate insulating film, (a3) forming a semiconductor layer on the gate insulating film, the semiconductor layer acting as an active layer of the switching device, and (a4) forming both a signal line including a drain electrode of the switching device and a source electrode of the switching device, the signal line intersecting with the scanning line, and the step (c5) including the step of patterning the electrically conductive transparent material into a pixel electrode and a common electrode on the interlayer insulating film, the pixel electrode being in electrical connection with the switching device, the common electrode being in electrical connection with the common line.

It is preferable that the electrically conductive transparent material is indium-tin oxide (ITO) or indium-zinc oxide (IZO).

The advantages obtained by the aforementioned present invention will be described hereinbelow.

In accordance with the present invention, an amorphous indium-tin oxide film is formed on an interlayer insulating film in a predetermined pattern, and then, the amorphous indium-tin oxide film is poly-crystallized by thermal annealing carried out after formation of an alignment film. Thus, the present invention makes it possible to pattern an indium-tin oxide film to a pixel electrode with accuracy and uniformity, but without etching residue. In particular, the present invention makes it possible, in an in-plane switching type liquid crystal display device including a common electrode and a pixel electrode both comprised of an indium-tin oxide film on an interlayer insulating film, to prevent non-uniformity in displayed images, caused by non-uniformity in patterning the indium-tin oxide film, and further to enhance a fabrication yield.

In addition, the present invention makes it possible to reduce an annealing step by one.

The present invention makes it possible, in a liquid crystal display device including an interlayer insulating film comprised of an electrically insulating organic film and an electrically insulating inorganic film and formed on a thin film transistor, to accurately and uniformly pattern an electrically conductive transparent film, and prevent a contact resistance between the electrically conductive transparent film and an underlying metal film, by applying helium (He) plasma to an interlayer insulating film prior to formation of a contact hole throughout the electrically insulating inorganic film. In particular, the present invention makes it possible, in an in-plane switching type liquid crystal display device including a common electrode and a pixel electrode both comprised of an electrically conductive transparent film on an interlayer insulating film, to prevent non-uniformity in displayed images, caused by non-uniformity in patterning the electrically conductive transparent film or by an increased contact resistance, and further to enhance a fabrication yield.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

Figure 1:
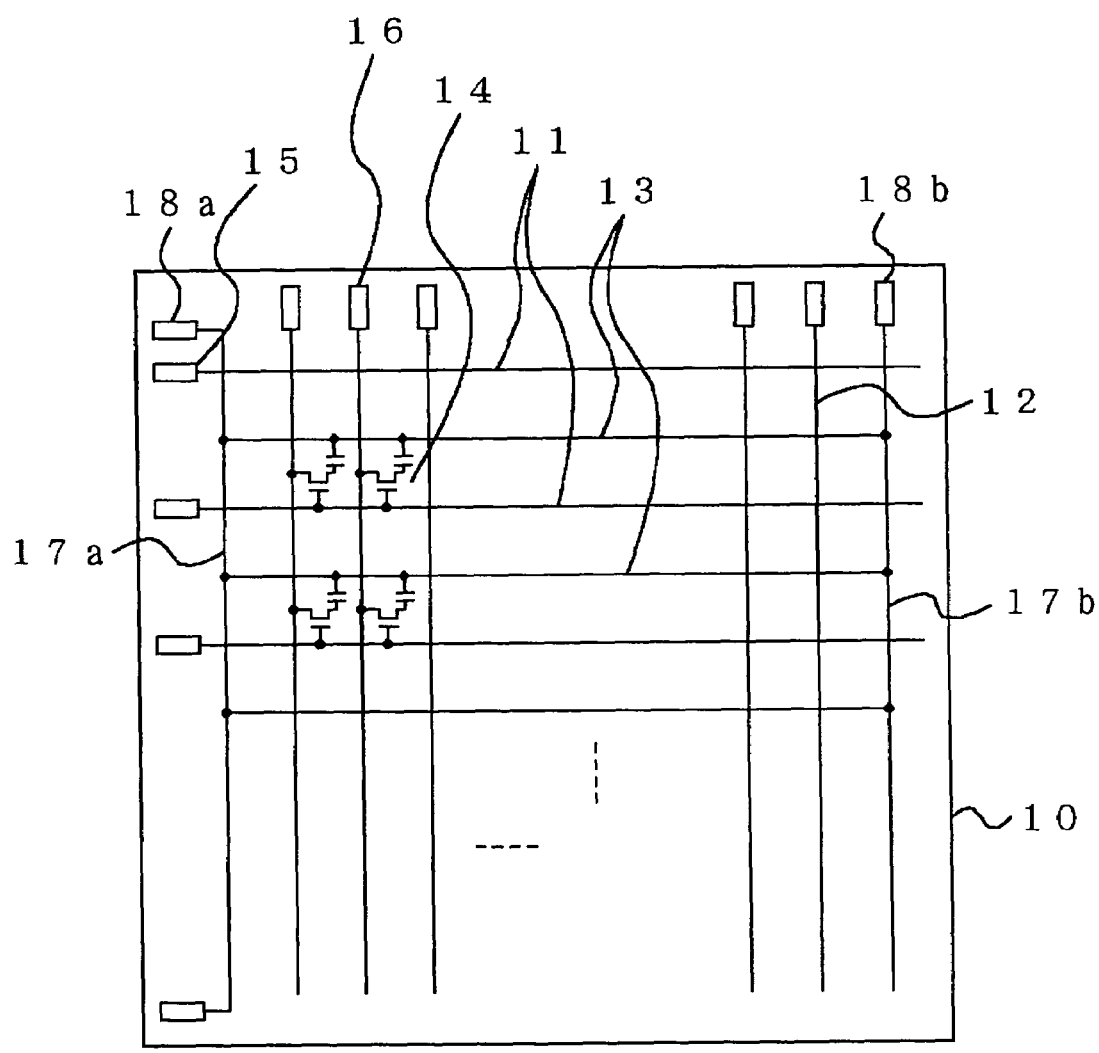
FIG. 1 is a plan view of a substrate on which a thin film transistor is to be fabricated, in an in-plane switching type liquid crystal display device fabricated by a method in accordance with the first embodiment of the present invention.

FIG. 1 is a plan view of a substrate on which a thin film transistor (TFT) is to be fabricated, in a liquid crystal display device fabricated by a method in accordance with the first embodiment of the present invention. In the first embodiment, an in-plane switching type liquid crystal display device is fabricated. Hereinbelow, the substrate is referred to simply as a TFT substrate.

As illustrated in FIG. 1, the TFT substrate 10 includes, on a surface thereof facing an opposing substrate, a plurality of scanning lines 11, a plurality of signal lines 12 each extending perpendicularly to the scanning lines 11, and a plurality of common lines 13 each extending between adjacent scanning lines 11 in parallel with the scanning lines 11. Thin film transistors (TFTs) 14 are fabricated in a matrix at intersections of the scanning lines 11 with the signal lines 12.

Each of the scanning lines 11 is connected at an end thereof to a scanning line terminal 15. A drive signal is input to each of the scanning lines 11 through each of the scanning line terminals 15 from an external driver circuit (not illustrated). Each of the signal lines 12 is connected at an end thereof to a signal-line terminal 16. A drive signal is input to each of the signal lines 12 through each of the signal-line terminals 16 from an external driver circuit (not illustrated).

The common lines 13 are bound to one another in order to apply a common voltage as a reference voltage for driving liquid crystal thereto. Specifically, common-line binding lines 17a and 17b extend at opposite marginal areas of the TFT substrate 10 in parallel with the signal lines 12. The common-line binding line 17a connects one ends (for instance, left ends) of the common lines 13 to one another, and the common-line binding line 17b connects the other ends (for instance, right ends) of the common lines 13 to one another. The common lines 13 and pixel electrodes electrically connected to source electrodes of TFTs 14 cooperate with each other to define capacities therebetween. The common-line binding line 17a is connected at ends thereof to a common-line terminal 18a, and the common-line binding line 17b is connected at ends thereof to a common-line terminal 18b.

Figure 2:
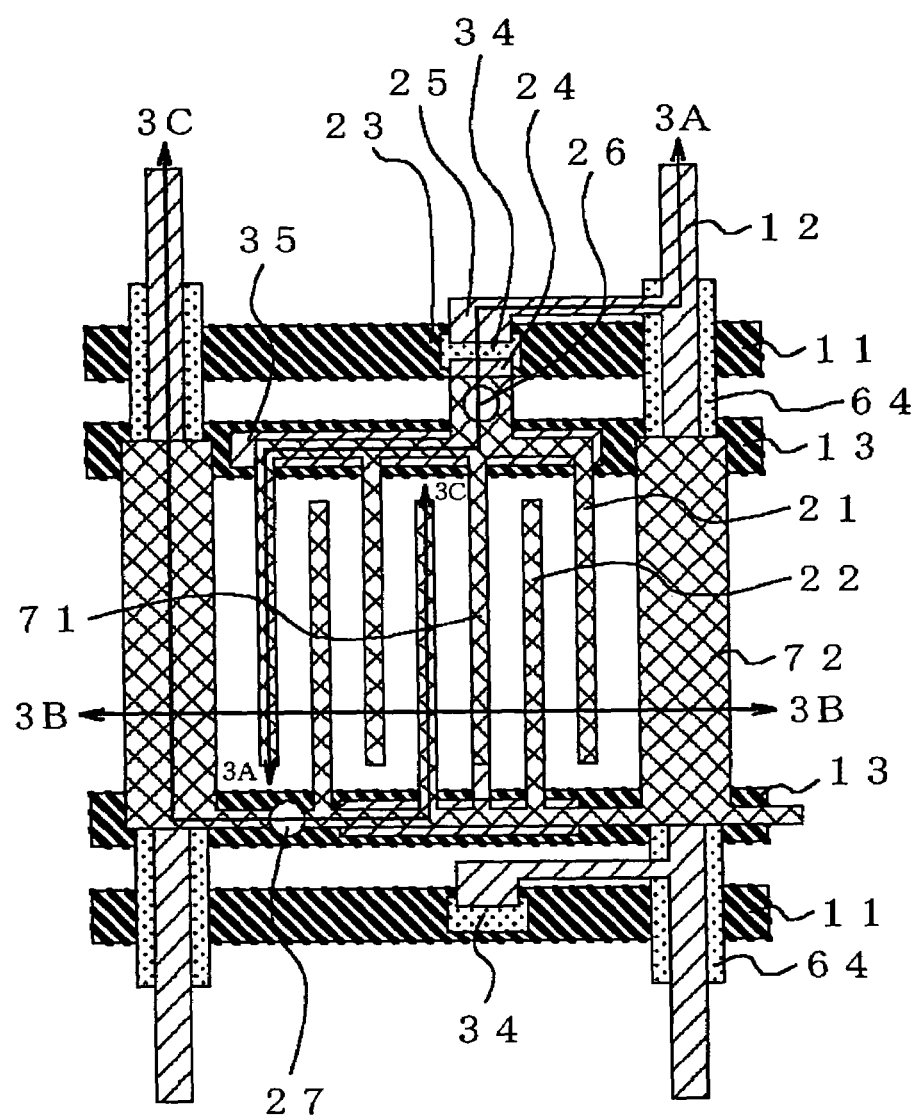
FIG. 2 is an enlarged plan view of a pixel in the substrate illustrated in FIG. 1.
Figure 3A:
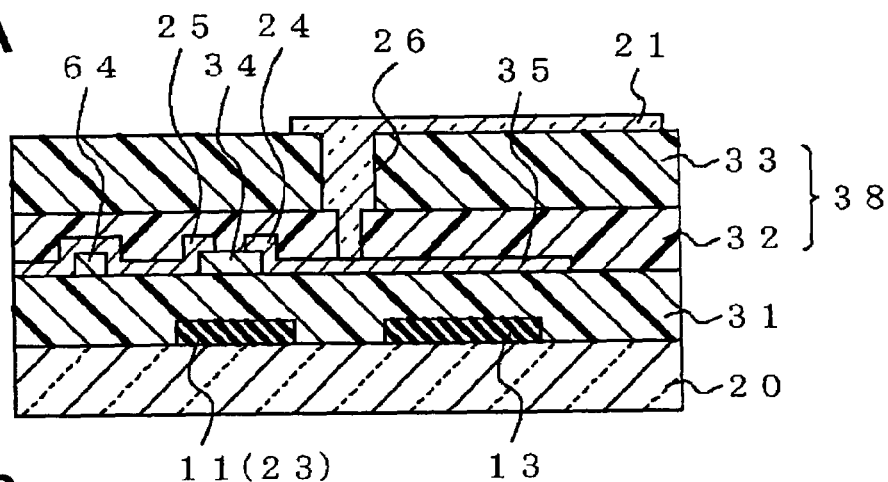
FIG. 3A is a cross-sectional view taken along the line 3A—3A in FIG. 2.
Figure 3B:
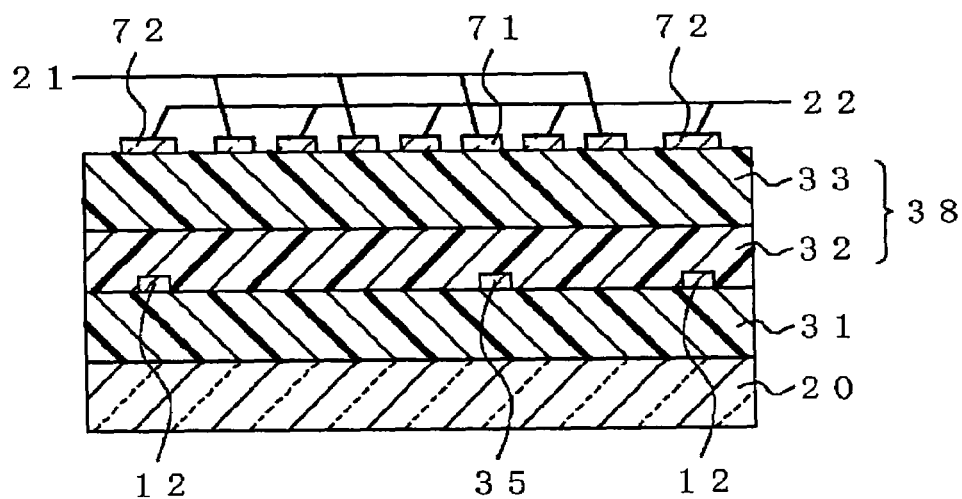
FIG. 3B is a cross-sectional view taken along the line 3B—3B in FIG. 2.
Figure 3C:
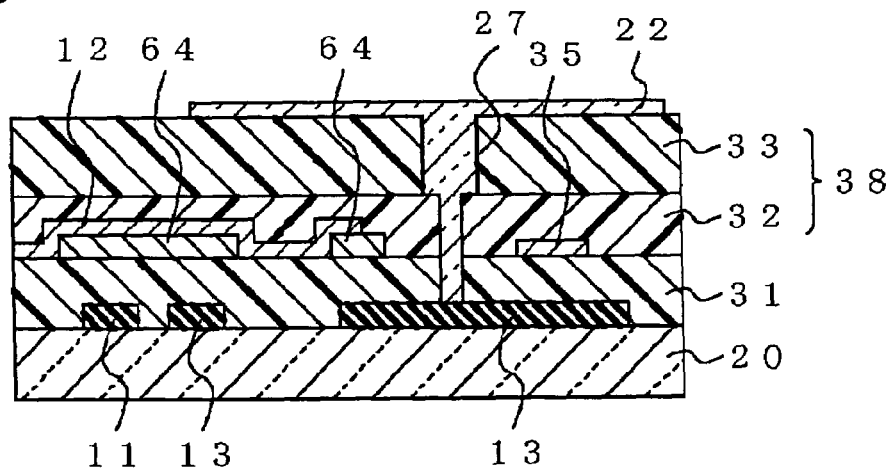
FIG. 3C is a cross-sectional view taken along the line 3C—3C in FIG. 2.
Figure 4:
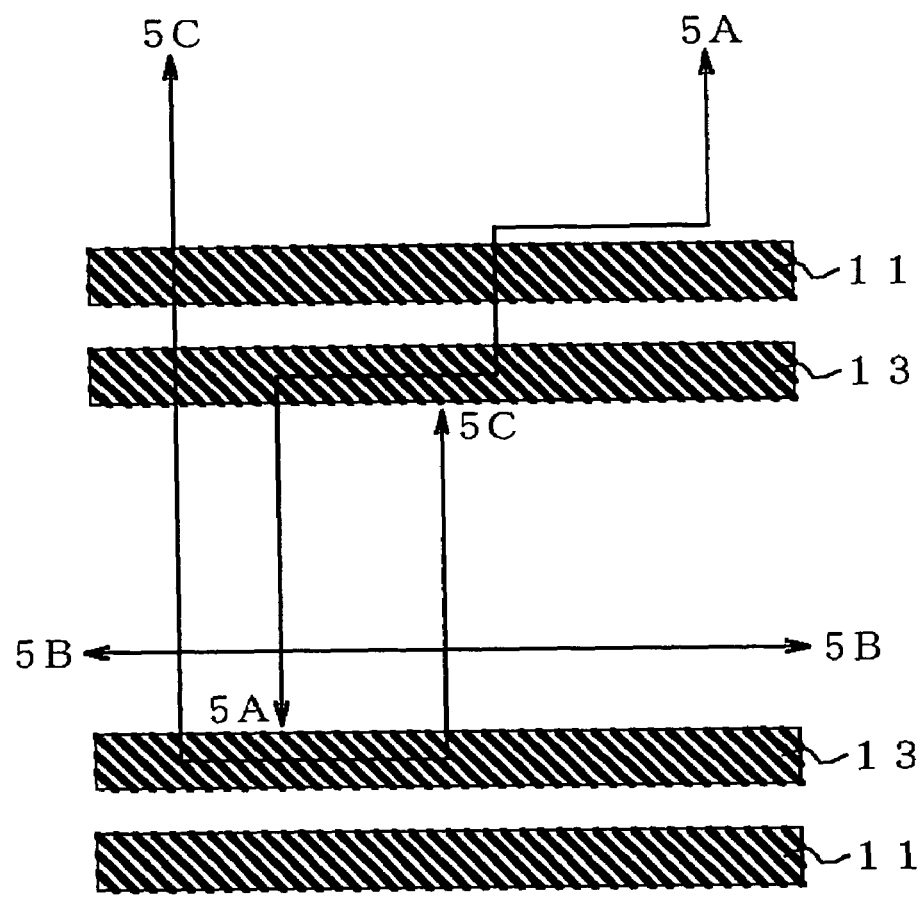
FIG. 4 is a plan view of a pixel, illustrating a first step of a method of fabricating a liquid crystal display panel including the substrate illustrated in FIG. 1.
Figure 5A:
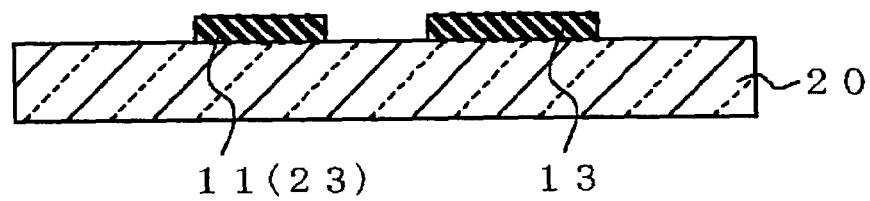
FIG. 5A is a cross-sectional view taken along the line 5A—5A in FIG. 4.
Figure 5B:
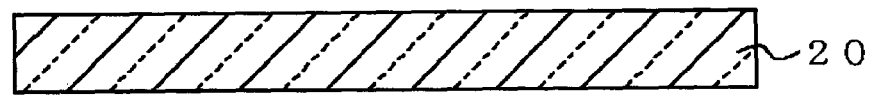
FIG. 5B is a cross-sectional view taken along the line 5B—5B in FIG. 4.
Figure 5C:
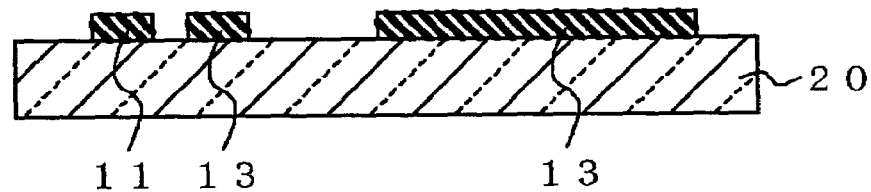
FIG. 5C is a cross-sectional view taken along the line 5C—5C in FIG. 4.
Figure 6:
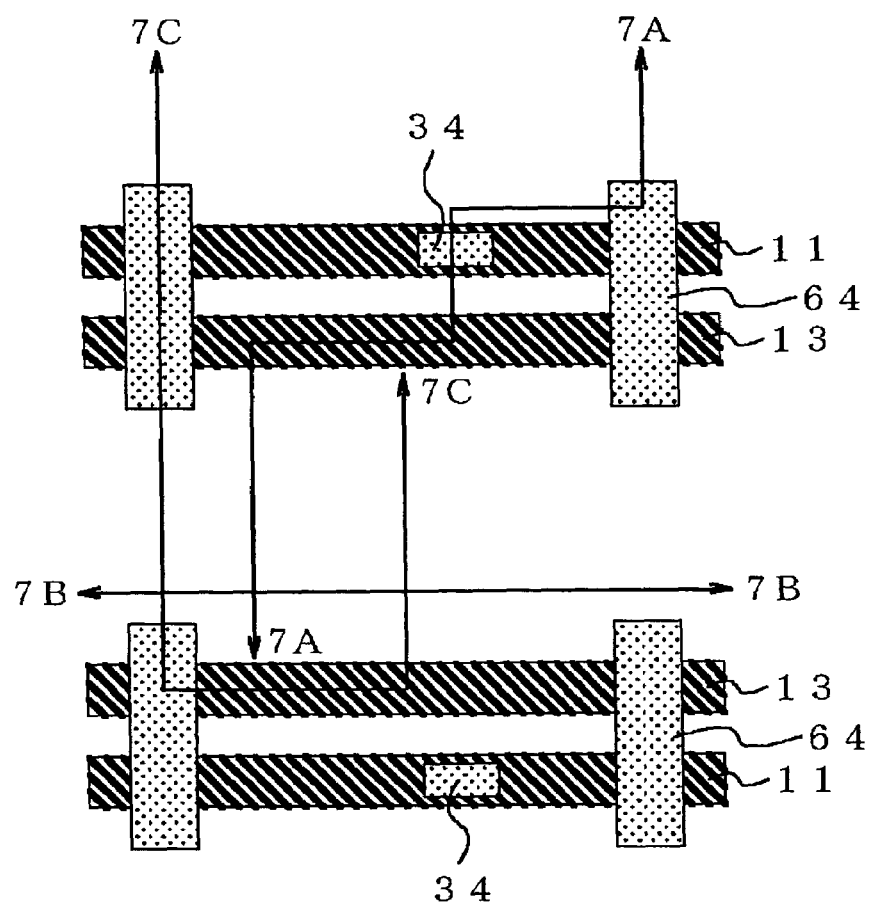
FIG. 6 is a plan view of a pixel, illustrating a second step of a method of fabricating a liquid crystal display panel including the substrate illustrated in FIG. 1.
Figure 7A:
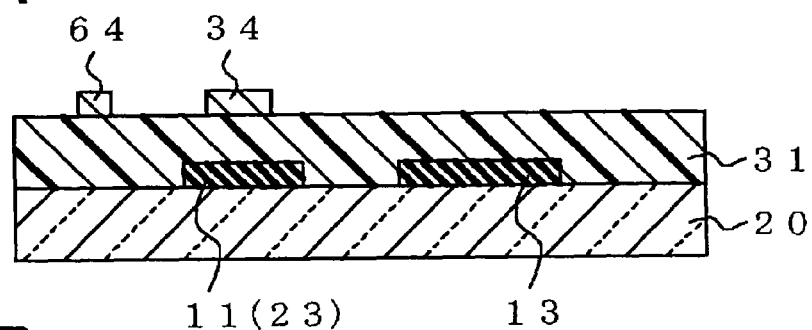
FIG. 7A is a cross-sectional view taken along the line 7A—7A in FIG. 6.
Figure 7B:
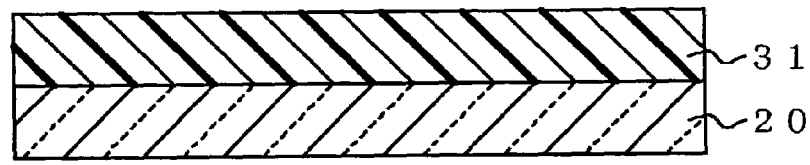
FIG. 7B is a cross-sectional view taken along the line 7B—7B in FIG. 6.
Figure 7C:
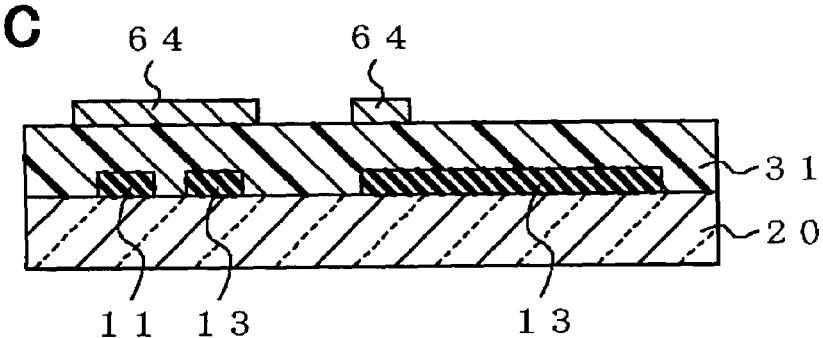
FIG. 7C is a cross-sectional view taken along the line 7C—7C in FIG. 6.
Figure 8:
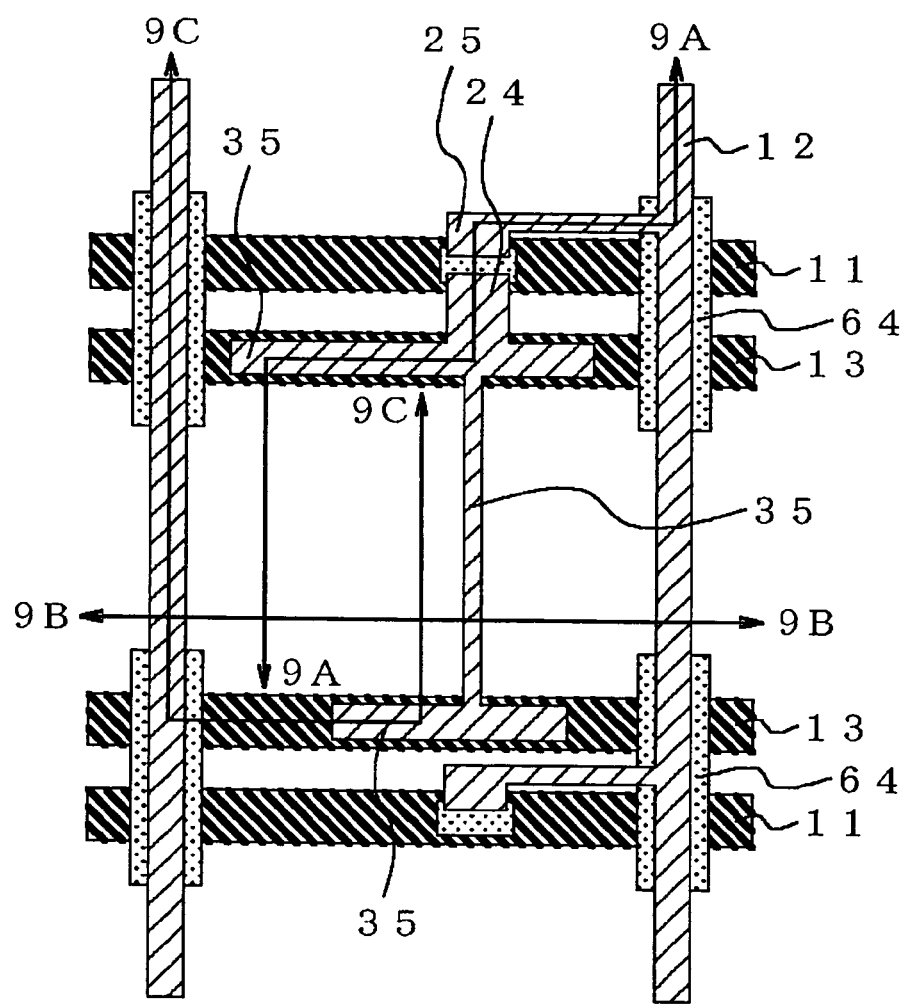
FIG. 8 is a plan view of a pixel, illustrating a third step of a method of fabricating a liquid crystal display panel including the substrate illustrated in FIG. 1.
Figure 9A:
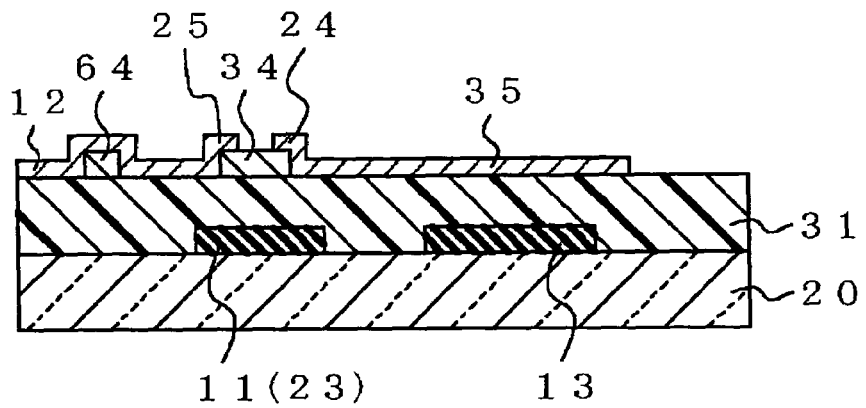
FIG. 9A is a cross-sectional view taken along the line 9A—9A in FIG. 8.
Figure 9B:
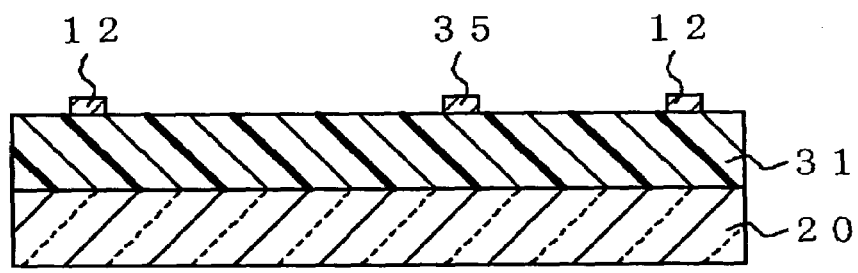
FIG. 9B is a cross-sectional view taken along the line 9B—9B in FIG. 8.
Figure 9C:
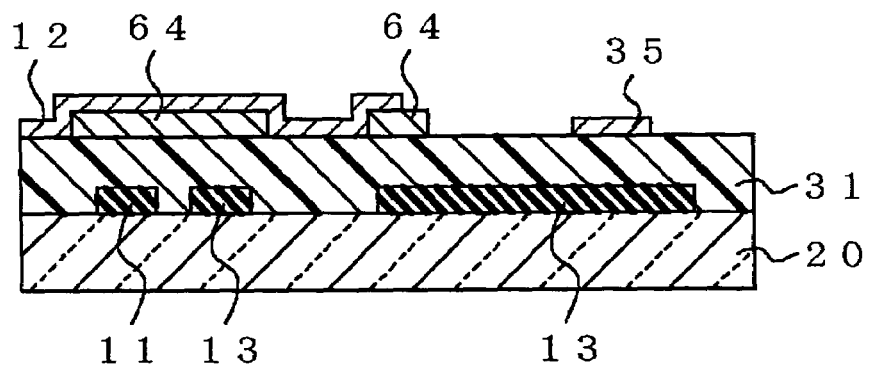
FIG. 9C is a cross-sectional view taken along the line 9C—9C in FIG. 8.

FIG. 2 is an enlarged plan view of a pixel in the TFT substrate 10 illustrated in FIG. 1. FIGS. 3A, 3B and 3C are cross-sectional views taken along the lines 3A—3A, 3B—3B and 3C—3C in FIG. 2, respectively.

As illustrated in FIG. 2, a pair of the scanning lines 11 adjacent to each other and a pair of the signal lines 12 adjacent to each other intersect with each other. Each of pixels has a display area defined as an area surrounded by a pair of the scanning lines 11 and a pair of the signal lines 12. Each of pixels has a comb-shaped pixel electrode 21 and a comb-shaped common electrode 22. Teeth of the pixel electrode 21 and teeth of the common electrode 22 are alternately arranged and face each other. An electric field is generated in parallel with the TFT substrate 10 between the pixel electrode 21 and the common electrode 22 for controlling alignment of liquid crystal molecules.

As illustrated in FIG. 3, the TFT substrate 10 is comprised of an electrically insulating transparent substrate 20 such as a glass substrate, the above-mentioned scanning lines 11 and common lines 13 both formed on the electrically insulating transparent substrate 20, a gate insulating film 31 formed on the substrate 20 such that the scanning and common lines 11 and 13 are covered with the gate insulating film 31, a thin film transistor (TFT) 14 fabricated on the gate insulating film 31, a passivation film 32 formed on the gate insulating film 31 such that the thin film transistor 14 is covered with the passivation film 32, an electrically insulating organic film 33 formed on the passivation film 32, and the above-mentioned pixel and common electrodes 21 and 22 both formed on the electrically insulating organic film 33.

The passivation film 32 and the electrically insulating organic film 33 constitute an interlayer insulating film 38. The pixel and common electrodes 21 and 22 are formed on the interlayer insulating film 38, as illustrated in FIGS. 3A and 3C.

The thin film transistor 14 is comprised of a gate electrode 23 formed on the electrically insulating transparent substrate 20, the above-mentioned gate insulating film 31 covering the gate electrode 23 therewith, a source electrode 24 formed on the gate insulating film 31, a drain electrode 25 formed on the gate insulating film 31, and a semiconductor layer 34 formed on the gate insulating film 31 between the source and drain electrodes 24 and 25.

In the first embodiment, the thin film transistor 14 is comprised of a reverse-stagger type TFT. As illustrated in FIG. 2, the gate electrode of the thin film transistor 14 is formed as a part of the scanning line 11, and the drain electrode of the thin film transistor 14 is formed as a part of the signal line 12.

As illustrated in FIG. 3A, the pixel electrode 21 is electrically connected to the source electrode 24 of the thin film transistor 14 through a contact hole 26 formed throughout the interlayer insulating film 38. As illustrated in FIG. 3C, the common electrode 22 is electrically connected to the common line 13 through a contact hole 37 formed throughout the interlayer insulating film 38 and the gate insulating film 31.

The thin film transistor 14 receives a scanning signal through the scanning line 11 and the gate electrode 23, and further receives a display signal through the signal line 12 and the drain electrode 25 for writing electric charges into the pixel electrode 21.

As illustrated in FIGS. 3A and 3C, an accumulation capacitor is formed between the common line 13 and an accumulation capacity electrode 35.

Hereinbelow is explained a method of fabricating the thin film transistor 14 in the first embodiment.

FIGS. 4, 6, 8, 10, 12 and 2 are plan views of each of steps for fabrication of a pixel. FIGS. 5A, 7A, 9A, 11A, 13A and 3A are cross-sectional views taken along the lines XA—XA (X=4, 6, 8, 10, 12 and 2) in FIGS. 4, 6, 8, 10, 12 and 2. Similarly, FIGS. 5B, 7B, 9B, 11B, 13B and 3B are cross-sectional views taken along the lines XB—XB (X=4, 6, 8, 10, 12 and 2) in FIGS. 4, 6, 8, 10, 12 and 2, and FIGS. 5C, 7C, 9C, 11C, 13C and 3C are cross-sectional views taken along the lines XC—XC (X=4, 6, 8, 10, 12 and 2) in FIGS. 4, 6, 8, 10, 12 and 2. FIGS. 5A, 7A, 9A, 11A, 13A and 3A illustrate cross-sections of the thin film transistor 14, the contact hole 26 for the pixel electrode 21, and the accumulation capacity. FIGS. 5B, 7B, 9B, 11B, 13B and 3B illustrate cross-sections of the pixel. FIGS. 5C, 7C, 9C, 11C, 13C and 3C illustrate cross-sections of the signal line 12, the contact hole 27 for the common electrode 22, and the accumulation capacity.

As illustrated in FIGS. 4 and 5A to 5C, an electrically conductive layer is formed on the substrate 20 by sputtering by a thickness in the range of about 100 to 300 nanometers. The electrically conductive layer is comprised of a chromium (Cr) layer, a molybdenum (Mo) layer, a Cr/Al layer or a Mo/Al layer, for instance. Then, the electrically conductive layer is etched by photolithography into the scanning line 11 including the gate electrode 23, the common line 13, the scanning-line terminal 16 (not illustrated), and the common-line terminals 18a and 18b (not illustrated).

Then, as illustrated in FIGS. 6 and 7A to 7C, the gate insulating film 31 comprised of a silicon nitride film is formed on the substrate 20 by plasma-enhanced chemical vapor deposition (PCVD) by a thickness in the range about 300 to 500 nanometers such that the scanning line 11, the common line 13, the scanning-line terminal 15 (not illustrated) and the common-line terminals 18a and 18b (not illustrated) are covered with the gate insulating film 31.

Then, an amorphous silicon (a–Si) film is formed on the gate insulating film 31 by a thickness in the range of about 150 to 300 nanometers, and then, an amorphous silicon film (n+ a–Si) into which phosphorus (P) was doped is formed on the amorphous silicon (a–Si) film by a thickness in the range of about 30 to 50 nanometers. Then, these amorphous silicon films (a–Si and n+ a–Si) are etched by photolithography into the semiconductor layer 34 on the gate insulating film 31. The semiconductor layer 34 acts as an active layer of the thin film transistor 14.

Concurrently with the formation of the semiconductor layer 34, a semiconductor layer 64 is formed on the gate insulating film 31 at intersections of the scanning line 11 and the common line 13 with the signal line 12 for enhancing withstand voltages of the scanning line 11, the common line 13 and the signal line 12.

Then, as illustrated in FIGS. 8 and 9A to 9C, an electrically conductive layer is formed on the gate insulating film 31 by sputtering by a thickness in the range of about 100 to 400 nanometers. For instance, the electrically conductive layer is comprised of a chromium (Cr) layer, a molybdenum (Mo) layer, a Cr/Al/Cr layer or a Mo/Al/Mo layer. Then, the electrically conductive layer is etched by photolithography into the source electrode 24, the drain electrode 25, the accumulation capacity electrode 35, the signal line 12 and the signal-line terminal 16.

Then, the n+ a–Si layer of the semiconductor layer 34 is etched into a channel with the source and drain electrodes 24 and 25 being used as a mask.

Figure 10:
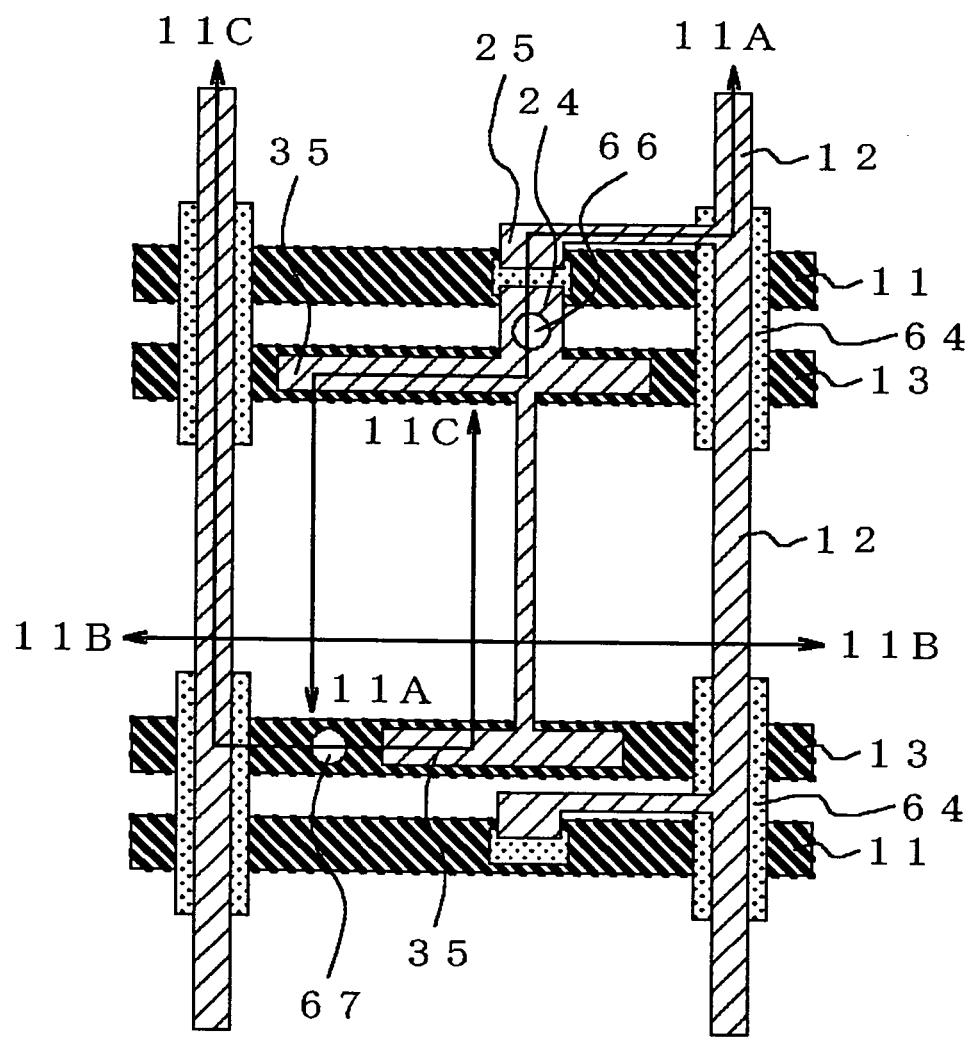
FIG. 10 is a plan view of a pixel, illustrating a fourth step of a method of fabricating a liquid crystal display panel including the substrate illustrated in FIG. 1.

As illustrated in FIGS. 10 and 11, the passivation film 32 is formed on the gate insulating film 31 by plasma-enhanced chemical vapor deposition (PCVD) by a thickness in the range of about 100 to 300 nanometers such that the source electrode 24, the drain electrode 25, the semiconductor layer 34, the accumulation capacity electrode 35, the signal line 12 and the signal-line terminal 16 are covered with the passivation film 32. The passivation film 32 is comprised of an inorganic film such as a silicon nitride film.

Then, the resultant is annealed at about 280 degrees centigrade in nitrogen atmosphere.

Figure 11A:
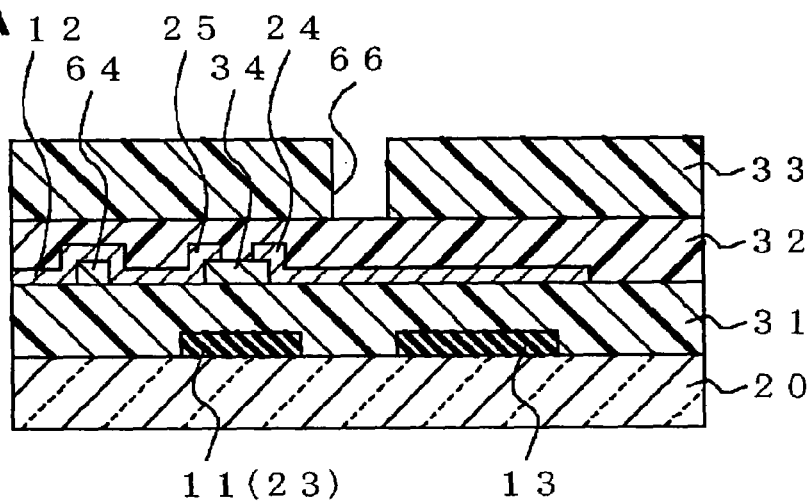
FIG. 11A is a cross-sectional view taken along the line 11A—11A in FIG. 10.
Figure 11B:
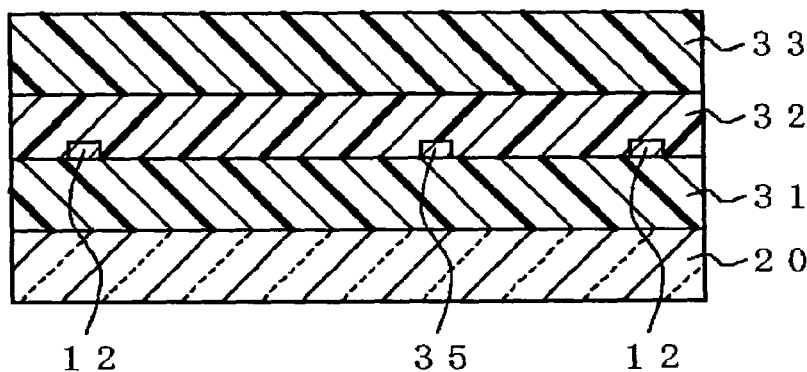
FIG. 11B is a cross-sectional view taken along the line 11B—11B in FIG. 10.
Figure 11C:
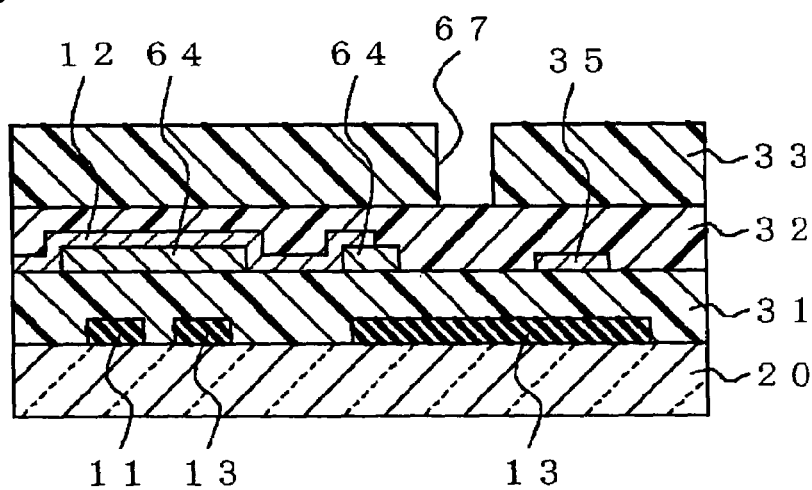
FIG. 11C is a cross-sectional view taken along the line 11C—11C in FIG. 10.
Figure 12:
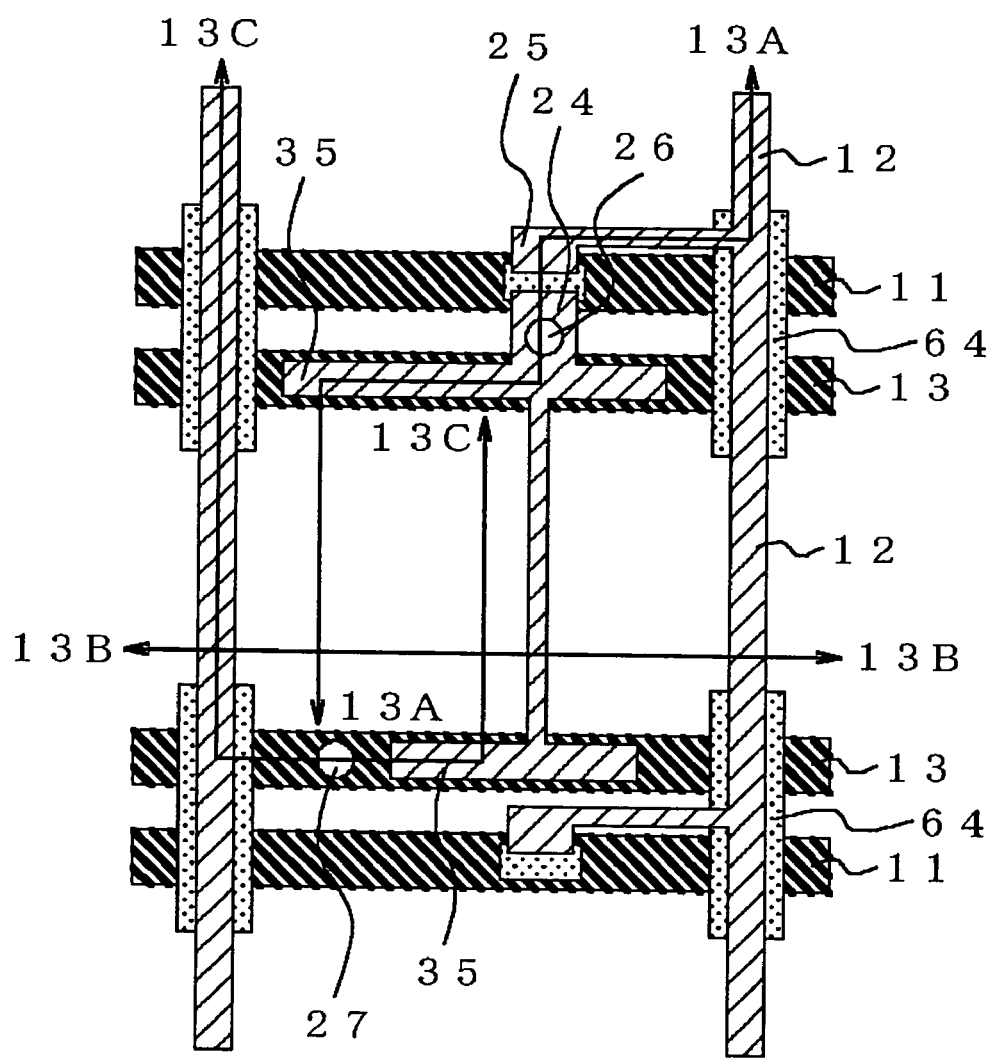
FIG. 12 is a plan view of a pixel, illustrating a fifth step of a method of fabricating a liquid crystal display panel including the substrate illustrated in FIG. 1.
Figure 13A:
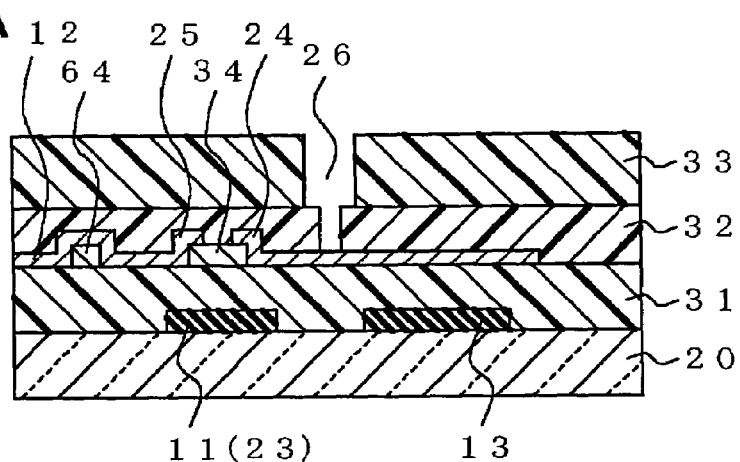
FIG. 13A is a cross-sectional view taken along the line 13A—13A in FIG. 12.
Figure 13B:
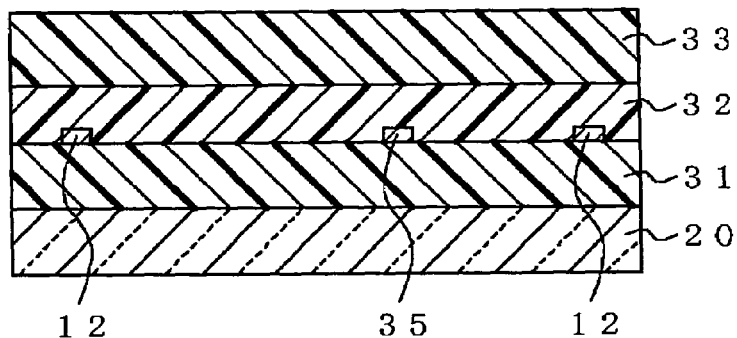
FIG. 13B is a cross-sectional view taken along the line 13B—13B in FIG. 12.
Figure 13C:
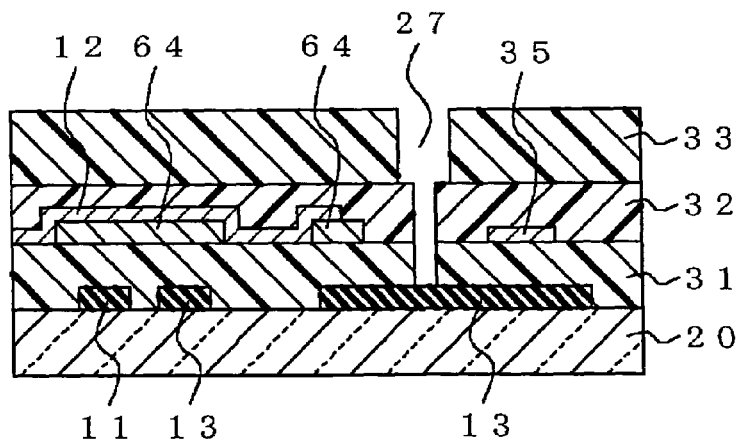
FIG. 13C is a cross-sectional view taken along the line 13C—13C in FIG. 12.

Then, the electrically insulating organic film 33 is formed on the passivation film 32 by a thickness in the range of about 1.5 to 3.5 micrometers through the use of a positive photo-sensitive novolak resist. Then, as illustrated in FIGS. 11A and 11C, holes 66 and 67 through which the contact holes 26 and 27 will be formed later are formed throughout the electrically insulating organic film 33 by photolithography and etching. Then, the electrically insulating organic film 33 is baked at about 230 degrees centigrade.

Then, as illustrated in FIGS. 12 and 13A to 13C, the passivation film 32 is etched by photolithography to thereby form the contact hole 26 (see FIG. 13A) in alignment with the hole 66, through which the source electrode 24 is exposed, and a contact hole (not illustrated) through which a metal film of the signal-line terminal 16 is exposed. Concurrently, the passivation film 32 and the gate insulating film 31 are etched to form the contact hole 27 (see FIG. 13C) in alignment with the hole 67, through which the common line 13 is exposed, a contact hole (not illustrated) through which a metal film of the scanning-line terminal 15 and a metal film of the common-line terminals 18a and 18b are exposed, and a contact hole (not illustrated) through which ends of the common lines 13 are exposed.

The passivation film 32 and the gate insulating film 31 may be etched by dry etching, wet etching or dry and wet etching.

Then, as illustrated in FIGS. 2 and 3A to 3C, an electrically conductive transparent film comprised of an indium-tin oxide (ITO) film is formed on the electrically insulating organic film 33 by sputtering. Then, the electrically conductive transparent film is etched by photolithography into the pixel electrode 21, the common electrode 22, a metal film of the scanning-line terminal 15, a metal film of the signal-line terminal 16, a connection electrode (not illustrated) located on a metal film of the common-line terminals 18a and 18b, and the common-line binding lines 17a and 17b such that, as illustrated in FIG. 3B, a common electrode 72 among the common electrodes 22 is formed on the electrically insulating organic film 33 in alignment with the signal line 12, and a pixel electrode 71 among the pixel electrodes 21 is formed on the electrically insulating organic film 33 in alignment with the accumulation capacity electrode 35. Thus, the pixel electrode 21 is electrically connected to the source electrode 24 through the contact hole 26, the common electrode 22 is electrically connected to the common line 13 through the contact hole 27, the connection electrode is electrically connected to the metal film of the scanning-line terminal 15, the metal film of the signal-line terminal 16 and the metal film of the common-line terminals 18a and 18b through the associated contact holes, and the common-line binding lines 17a and 17b are electrically connected to ends of the common lines 13 through the contact hole formed for the common-line binding lines 17a and 17b. Structures of the terminals are explained later.

The indium-tin oxide film is deposited by reactive sputtering in argon (Ar) and oxygen ($O_2$) gases atmosphere. Oxygen gas is mixed with argon gas at about 1 to 5 atom %. Water or hydrogen gas may be mixed to argon gas at about 1 atom %. The substrate is not heated during deposition of the indium-tin oxide film, and the indium-tin oxide film is not annealed after the deposition thereof Thus, an amorphous indium-tin oxide film is formed on the electrically insulating organic film 33.

The amorphous indium-tin oxide film is etched by wet etching through the use of etchant such as aqua regia or oxalic acid. The amorphous indium-tin oxide film can be etched without etching residue, if a small amount of water or hydrogen is added to etchant. A period of time during which the amorphous indium-tin oxide film is etched is determined in accordance with an etching rate of the film. It is possible to control side-etching to be within about 1 micrometer on the electrically insulating organic film. Herein, side-etching is defined as a line width obtained by subtracting a line width of an etched indium-tin oxide film from a line width of a developed photoresist.

Hereinbelow is explained the terminals of the TFT substrate 10 in the first embodiment.

Figure 14:
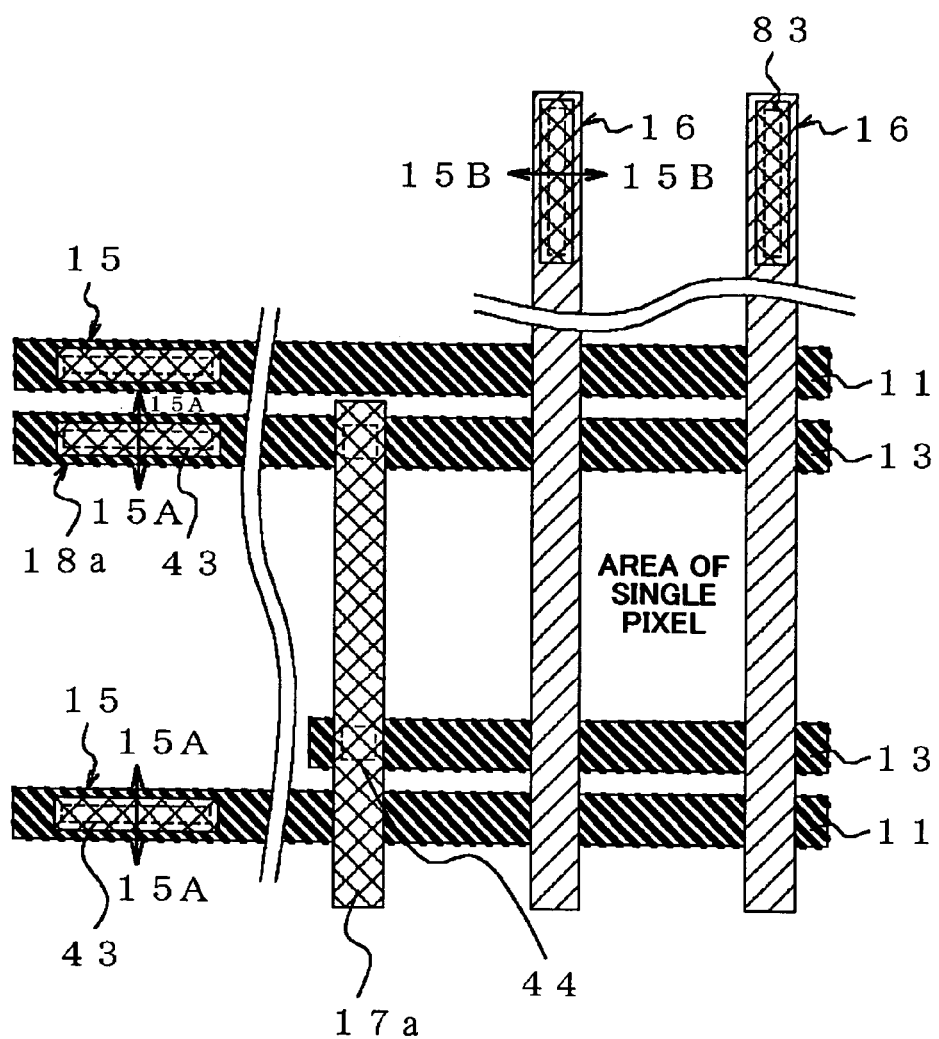
FIG. 14 is a plan view of terminal sections around the substrate illustrated in FIG. 1.
Figure 15A:
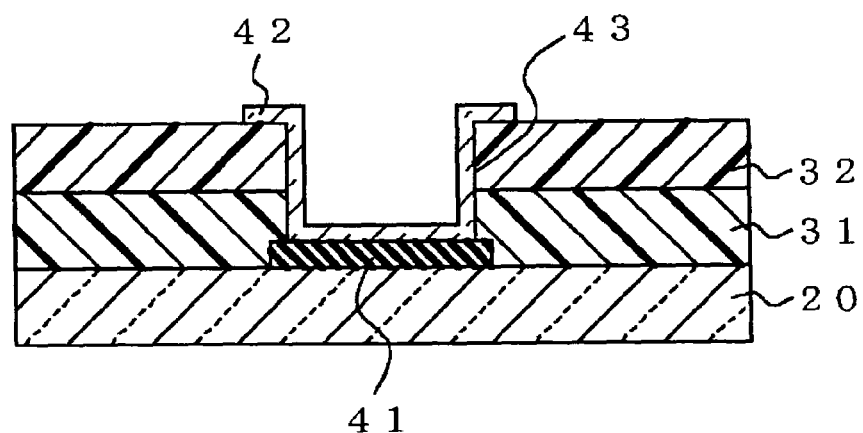
FIG. 15A is a cross-sectional view taken along the line 15A—15A in FIG. 14.

FIG. 14 is a plan view of the terminals of the TFT substrate 10. FIG. 15A is a cross-sectional view taken along the line 15A—15A in FIG. 14, illustrating the scanning-line terminal 15 and the common-line terminals 18a and 18b, and FIG. 15B is a cross-sectional view taken along the line 15B—15B in FIG. 14, illustrating the signal-line terminal 16.

As illustrated in FIG. 15A, the scanning-line terminal 15 and the common-line terminals 18a and 18b are formed as a connection electrode 42 comprised of an electrically conductive transparent film (an indium-tin oxide film) of which the common electrode 22 is comprised, above a terminal metal film 41 formed on the electrically insulating transparent substrate 20 and comprised of a metal film of which the scanning line 11 is comprised.

Figure 15B:
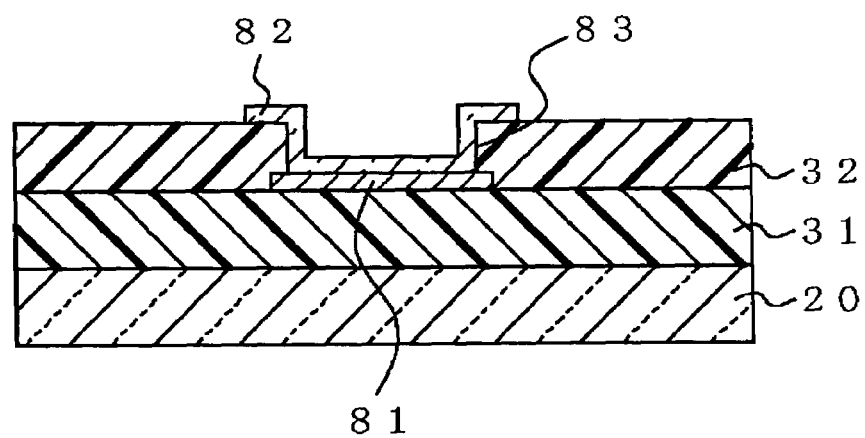
FIG. 15B is a cross-sectional view taken along the line 15B—15B in FIG. 14.

As illustrated in FIG. 15B, the signal-line terminal 16 is formed as a connection electrode 82 comprised of an electrically conductive transparent film (an indium-tin oxide film) of which the common electrode 22 is comprised, above a terminal metal film 81 formed on the gate insulating film 31 and comprised of a metal film of which the signal line 12 is comprised.

The connection electrode 42 is electrically connected to a terminal metal film 41 through a contact hole 43 formed throughout the gate insulating film 31 and the passivation film 32, and the connection electrode 82 is electrically connected to a terminal metal film 81 through a contact hole 83 formed throughout the passivation film 32. The scanning-line and signal-line terminals 15 and 16, namely, the connection electrodes 42 and 82 are designed not to include the electrically insulating organic film 33.

Side-etching of the indium-tin oxide film formed on the passivation film 32 is smaller than side-etching of the indium-tin oxide film formed on the electrically insulating organic film 33. Accordingly, since the side-etching of the indium-tin oxide film formed on the electrically insulating organic film 33 is controlled to be within about 1 micrometer, no problems are caused.

The common lines 13 are electrically connected to the common-line binding lines 17a and 17b through a contact hole 44 (see FIG. 14). Though not illustrated, the contact hole 44 has the same cross-section as that of the contact hole 43 illustrated in FIG. 15A.

In the first embodiment, each of the common-line binding lines 17a and 17b are comprised of an electrically conductive transparent film. As an alternative, the common-line binding lines 17a and 17b may be comprised of a metal film of which the signal line 12 is comprised.

Though not illustrated, the common-line binding lines 17a and 17b may be electrically connected at a part thereof to an electrically conductive transparent film formed on the electrically insulating organic film 33, through a contact hole formed throughout the passivation film 32 and the electrically insulating organic film 33. In addition, the common-line binding lines 17a and 17b may be electrically connected at ends thereof to the above-mentioned electrically conductive transparent film formed on the electrically insulating organic film 33, through a contact hole formed throughout the gate insulating film 31 and the passivation film 32. The common-line binding lines 17a and 17b may be electrically connected to the common lines 13 through an electrically conductive transparent film in the above-mentioned way. By electrically connecting the common-line binding lines 17a and 17b to the common lines 13, it would be possible to lower a resistance of the common-line binding lines 17a and 17b.

Hereinbelow is explained a method of fabricating a liquid crystal panel including the above-mentioned TFT substrate 10.

Figure 16:
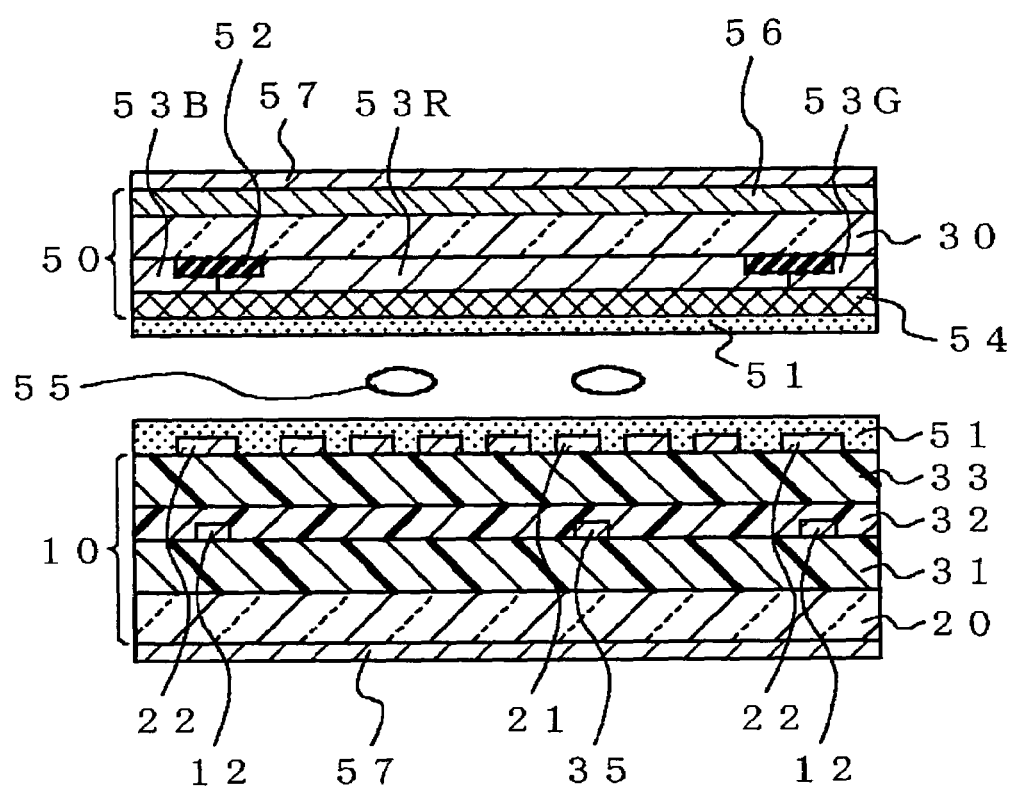
FIG. 16 is a cross-sectional view of a pixel in a liquid crystal display panel including the substrate illustrated in FIG. 1.

FIG. 16 is a cross-sectional view of a pixel in the liquid crystal panel.

The illustrated liquid crystal panel is comprised of the above-mentioned TFT substrate 10, an opposing substrate 50 arranged in facing relation to the TFT substrate 10, and a liquid crystal layer 55 sandwiched between the TFT substrate 10 and the opposing substrate 50.

The opposing substrate 50 is comprised of an electrically insulating transparent substrate 30 such as a glass substrate, a black matrix 52 formed on a surface of the substrate 30 which surface faces the opposing substrate 50, three-colored color filters 53R, 53G and 53B formed on the substrate 30, covering the black matrix 52 therewith, an overcoat film 54 formed on the color filters 53R, 53G and 53B, and an electrically conductive transparent layer 56 formed on a surface of the substrate 30 which surface faces oppositely to the TFT substrate 10.

The liquid crystal panel is fabricated as follows.

After fabricating the TFT substrate 10 in the above-mentioned way, an alignment film 51 is formed on the electrically insulating organic film 33. The alignment film 51 is compound polyimide alignment material, and has a thickness in the range of 30 to 60 nanometers. Then, the TFT substrate 10 is baked at 180 to 240 degrees centigrade for aligning the alignment film 51.

Then, sealing material (not illustrated) composed of epoxy resin adhesive is adhered to a marginal area of the TFT substrate 10.

By baking the TFT substrate 10 after formation of the alignment film 51, the electrically conductive transparent film is also annealed. That is, by baking the TFT substrate 10 after formation of the alignment film 51, it is possible to turn the amorphous indium-tin oxide film into a poly-crystal indium-tin oxide film, enhance light-transmissivity of a resultant indium-tin oxide film, and reduce a resistance of a resultant indium-tin oxide film.

Then, an electrically conductive transparent layer 56 is formed on a surface of the substrate 30 which surface does not face the TFT substrate 10. The electrically conductive transparent layer 56 is comprised of an indium-tin oxide film, for instance, and has a thickness in the range of about 80 to 150 nanometers.

Then, the black matrix 52 is formed on a surface of the electrically insulating organic film 33 which surface faces the TFT substrate 10. The black matrix 52 is comprised of a negative photo-sensitive resist in which acrylic pigment is dispersed, or a carbon resist, for instance, has a thickness in the range of 1 to 3 nanometers, has an optical density (OD) of three or higher, and has a sheet resistance of $1\times10^{10}$ ohms per a unit area.

Then, the red color filter 53R is formed on the substrate 30 through the use of a negative photo-sensitive resist in which acrylic pigment is dispersed. The red color filter 53R has a thickness in the range of about 1.0 to 1.5 micrometers. The blue color filter 53B and the green color filter 53G are formed in the same way.

Then, the overcoat layer 54 is formed on the color filters 53R, 53B and 53G through the use of novolak resist. The overcoat layer 54 is comprised of an electrically insulating organic film and has a thickness in the range of about 2.0 to 3.5 nanometers.

Then, the alignment film 51 composed of polyimide alignment material and having a thickness in the range of 30 to 60 nanometers is formed on the overcoat layer 54. Thereafter, a resultant is baked for aligning the alignment film 51. Thus, there is completed the opposing substrate 50.

Then, the TFT substrate 10 and the opposing substrate 50 are aligned to each other with the above-mentioned sealing material and spacers (not illustrated) being sandwiched therebetween.

Then, liquid crystal 55 composed of fluorine compound is introduced into a space formed between the substrates 10 and 50, through an inlet opening (not illustrated). Then, the inlet opening is closed with sealing material composed of acrylate resin which is hardened when ultra-violet rays are irradiated thereto. Thus, there is obtained a liquid crystal panel having a predetermined gap between the TFT substrate 10 and the opposing substrate 50. For instance, a gap may be controlled by means of a color filter (not illustrated) having pillars and composed of acrylic resin.

Then, a polarizer 57 comprised of a polarizing film composed of iodine compound is adhered to a surface of the TFT substrate 10 which surface does not face the opposing substrate 50, and further to a surface of the opposing substrate 50 which surface does not face the TFT substrate 10.

Thus, there is completed a liquid crystal panel including the TFT substrate 10 and having a broad viewing angle and a high aperture ratio.

As explained above, in accordance with the first embodiment, it is possible to accurately and uniformly pattern an indium-tin oxide film into a pixel electrode by forming an amorphous indium-tin oxide film on an electrically insulating organic film, and baking the amorphous indium-tin oxide film after formation of an alignment film for poly-crystallizing the amorphous indium-tin oxide film.

In addition, it is possible to reduce an annealing step by one in a process of fabricating a TFT substrate.

[Second Embodiment]

In the second embodiment, plasma is applied onto the electrically insulating organic film 33.

The steps in the first embodiment, having been explained with reference to FIGS. 2 to 11C are carried out. Thus, the electrically insulating organic film 33 is now formed on the passivation film 32.

Then, helium (He) plasma is applied all over to a resultant. Application of helium plasma is carried out by discharging helium gas at high frequency in a dry-etching apparatus, for instance.

Thereafter, as illustrated in FIGS. 12 and 13A to 13C, the passivation film 32 is etched by photolithography to thereby form the contact hole 26 (see FIG. 13A) in alignment with the hole 66, through which the source electrode 24 is exposed, and a contact hole (not illustrated) through which a metal film of the signal-line terminal 16 is exposed. Concurrently, the passivation film 32 and the gate insulating film 31 are etched to form the contact hole 27 (see FIG. 13C) in alignment with the hole 67, through which the common line 13 is exposed, a contact hole (not illustrated) through which a metal film of the scanning-line terminal 15 and a metal film of the common-line terminals 18a and 18b are exposed, and a contact hole (not illustrated) through which ends of the common lines 13 are exposed.

The passivation film 32 and the gate insulating film 31 may be etched by dry etching, wet etching or dry and wet etching.

If the contact hole is formed by dry etching, the substrate is not post-baked after photoresist has been developed. If the contact hole is formed by wet etching or formed firstly by wet etching and subsequently by dry etching, the substrate is post-baked at about 140 degrees centigrade after photoresist has been developed.

Then, as illustrated in FIGS. 2, 3A to 3C and 14 to 16, an electrically conductive transparent film composed of indium-tin oxide is formed on the electrically insulating organic film 33 by sputtering, and then, is patterned by photolithography and etching into the pixel electrode 21, the common electrode 22, the connection electrode 42, the connection electrode 82 and the common-line binding lines 17a and 17b such that, as illustrated in FIG. 3B, a common electrode 72 among the common electrodes 22 is formed on the electrically insulating organic film 33 in alignment with the signal line 12, and a pixel electrode 71 among the pixel electrodes 21 is formed on the electrically insulating organic film 33 in alignment with the accumulation capacity electrode 35. Thus, the pixel electrode 21 is electrically connected to the source electrode 24 through the contact hole 26, the common electrode 22 is electrically connected to the common line 13 through the contact hole 27, the connection electrode 42 is electrically connected to the metal film 41 of the scanning-line terminal 15 and common-line terminals 18a and 18b through the associated contact hole 43, the connection electrode 82 is electrically connected to the metal film 81 of the scanning-line terminal 15 through the associated contact hole 83, and the common-line binding lines 17a and 17b are electrically connected to ends of the common lines 13 through the contact hole 44.

The indium-tin oxide film is formed in the same condition as that of the first embodiment.

The above-mentioned electrically conductive transparent film may be comprised of an indium-zinc oxide (IZO) film in place of an indium-tin oxide (ITO) film. When the electrically conductive transparent film is comprised of an indium-zinc oxide (IZO) film, a resultant film is amorphous regardless of conditions in which the electrically conductive transparent film is formed.

A liquid crystal panel including the TFT substrate 10 in accordance with the second embodiment is fabricated in the same way as the liquid crystal panel mentioned in the first embodiment.

As explained above, it is possible to accurately and uniformly pattern an electrically conductive transparent film such as an indium-tin oxide film, and further to prevent increase in a contact resistance between the electrically conductive transparent film and an underlying metal film, by applying helium (He) plasma to the electrically insulating organic film prior to formation of a contact hole throughout the electrically insulating inorganic film.

Table 1 shows a relation among film quality of an indium-tin oxide film, line-width shift, and defectiveness in patterning an indium-tin oxide film.

TABLE 1

| Film Quality of ITO | Line-width Shift | Defectiveness in patterning |
| --- | --- | --- |
| Poly-crystal | ○ | X |
| Amorphous | ○ | ○ |

○ (Non-defective)
X (Defective)

If an indium-tin oxide film is heated at about 200 degrees centigrade during being formed or annealed at about 200 degrees centigrade after formed, a resultant indium-tin oxide film becomes a poly-crystal film. This results in that it would be necessary to lengthen etching time, because an etching rate of an indium-tin oxide film is low, and etching residue is likely to be generated. It is possible to control side-etching of an indium-tin oxide film formed on an electrically insulating organic film, to be within about 1 micrometer. No problems are caused with respect to line-width shift of an indium-tin oxide film formed on an electrically insulating organic or inorganic film.

However, according to the results of the experiments having been conducted by the inventors, it was found out there was a problem of a cut-out in a patterned indium-tin oxide film formed on an electrically insulating organic film. It is considered this is because film quality of a poly-crystallized indium-tin oxide film is partially non-uniform.

In contrast, an indium-tin oxide film will be amorphous, if the indium-tin oxide film is not heated during formation thereof and/or if the indium-tin oxide film is formed in atmosphere containing moisture or hydrogen at about 1 atom %. A resultant indium-tin oxide film would have a high etching rate, and no etching residue would be generated. Etching time can be shortened in accordance with an etching rate of an indium-tin oxide film. It is possible to control side-etching of an indium-tin oxide film formed on an electrically insulating organic film, to be within about 1 micrometer. No problems are caused with respect to line-width shift of an indium-tin oxide film formed on an electrically insulating organic or inorganic film. It is possible to prevent a problem of a cut-out in a patterned indium-tin oxide film formed on an electrically insulating organic film.

Table 2 shows a relation, observed when plasma is applied to an electrically insulating organic film after formation of a contact hole, among the plasma, uniformity in etching an indium-tin oxide film, and a contact resistance between an indium-tin oxide film and an underlying metal film.

TABLE 2

| Plasma | Etching Uniformity | Contact Resistance |
| --- | --- | --- |
| Ar | ○ | ○ |
| He | ○ | X |
| $O_2$ | — | Δ |
| $CF_4$ | X | X |

○ (Non-defective)
X (Defective)
— (No Changes)
Δ (Not Improved)

Uniformity in etching an indium-tin oxide film is judged based on quality of the common and pixel electrodes in the in-plane switching type liquid crystal display device in accordance with the first and second embodiments, and further based on non-uniformity in displayed images, caused by the non-uniformity of etching. A contact resistance between an indium-tin oxide film and an underlying metal film is judged based on a contact resistance between the indium-tin oxide film and the metal films (chromium films) of the common and signal lines in the in-plane switching type liquid crystal display device in accordance with the first and second embodiments, and further based on non-uniformity in displayed images, caused by the contact resistance.

According to the results of the experiments having been conducted by the inventors, the followings are found out.

Application of argon (Ar) plasma ensures quite good uniformity in etching an indium-tin oxide film, and further ensures that a contact resistance is reduced in comparison with no application of argon plasma, if argon plasma is applied in conditions close to conditions selected for sputter etching.

Application of helium (He) plasma ensures quite good uniformity in etching an indium-tin oxide film. However, a contact resistance is increased in comparison with no application of helium plasma. This is considered because advantageous effects of sputtering etching are not obtained.

Application of oxygen ($O_2$) plasma presents etching uniformity equal to etching uniformity obtained when oxygen ($O_2$) plasma is not applied to the substrate. That is, no improvement was found. A contact resistance is slightly improved in comparison with no application of oxygen plasma. Non-uniformity in displayed images, caused by a contact resistance, is not improved.

Application of fluorine gas plasma such as $CF_4$ gas deteriorates etching uniformity and a contact resistance in comparison with no application of fluorine gas plasma.

Based on the above-mentioned results, it was found out that helium plasma should be applied to the substrate prior to formation of a contact hole.

According to the results of the experiments having been conducted by the inventors, it was found out that if an indium-tin oxide film is post-baked after development of a photoresist in the step of forming a contact hole in the above-mentioned first and second embodiments, uniformity in etching an indium-tin oxide film is deteriorated. Though the reason is not obvious, it is considered that post-baking strengthens close contact between an electrically insulating organic film and a photoresist, and hence, since the electrically insulating organic film is partially removed at its surface when the photoresist is removed after formation of a contact hole, an exposed surface of the electrically insulating organic film is influences by remover solution, resulting in poor contact of the electrically insulating organic film with a newly formed indium-tin oxide film.

Accordingly, when a contact hole is formed by dry etching, it is preferable not to post-bake a photoresist.

In contrast, when a contact hole is formed by wet etching or by wet and dry etching, it is necessary to post-bake a photoresist, and hence, it is preferable that helium plasma is applied to the substrate prior to formation of a contact hole. It should be noted that if a contact hole is formed by wet etching, it is necessary to optimize conditions with which helium plasma is applied to the substrate and a photoresist is post-baked, because etchant is likely to penetrate a photoresist due to application of helium plasma.

In the above-mentioned first and second embodiments, the interlayer insulating film 38 is designed to have a multi-layered structure comprised of the electrically insulating inorganic film 32 and the electrically insulating organic film 33. It should be noted that the electrically insulating organic film 33 is formed only on the signal line 12 or only on the signal line 12 and the scanning line 11. That is, the interlayer insulating film 38 is designed to have the multi-layered structure including the electrically insulating organic film 33, only in an area extending on the signal line 12 or on the signal and scanning lines 12 and 11, and may be designed to be comprised singly of the electrically insulating inorganic film 32 in an area except the above-mentioned area.

The interlayer insulating film 38 in the first embodiment is designed to have a multi-layered structure comprised of the electrically insulating inorganic film 32 and the electrically insulating organic film 33. It should be noted that the interlayer insulating film 38 in the first embodiment may be comprised only of the electrically insulating organic film 33.

In the above-mentioned first and second embodiments, the common electrode 72 is designed to partially cover the signal line 12 therewith except an area at which the scanning line 11 and the signal line 12 intersect with each other. As an alternative, the common electrode 72 may be designed to cover therewith the signal line 12 wholly as well as an area at which the scanning line 11 and the signal line 12 intersect with each other, or to cover therewith both of the scanning line 11 and the signal line 12 wholly.

Specifically, the electrically insulating organic film 33 in the first and second embodiments is used for reducing coupling capacity of the common electrode 72 with the signal line 12. Hence, when the common electrode 72 is formed to partially cover the signal line 12 therewith except an area at which the scanning line 11 and the signal line 12 intersect with each other, it is not necessary to form the electrically insulating organic film 33 to wholly cover the signal line 12 therewith. The electrically insulating organic film 33 may be formed at least in alignment with the common electrode 72 except an area at which the scanning line 11 and the signal line 12 intersect with each other.

In the first and second embodiments, the present invention is applied to an in-plane switching (IPS) type liquid crystal display device. It should be noted that the present invention may be applied to any liquid crystal display device, if it includes an electrically conductive transparent film patterned on an electrically insulating organic film. For instance, the present invention may be applied to a twisted nematic (TN) type liquid crystal display device or a vertical alignment (VA) type liquid crystal display device.

In the first and second embodiments, the electrically insulating organic film 33 is composed of photo-sensitive novolak resist. As an alternative, the electrically insulating organic film 33 may be composed of polyimide resin or acrylic resin.

An electrically insulating organic non-photosensitive film may be used in place of an electrically insulating organic photosensitive film, in which case, steps of etching the film and removing a resist are additionally carried out.

In the above-mentioned first and second embodiments, the step of forming a contact hole throughout an electrically insulating organic film and the step of forming a contact hole throughout a passivation film are carried out under separate photolithography. However, those steps may be carried out under common photolithography.

In the above-mentioned first and second embodiments, the liquid crystal displays are designed to include a reverse-stagger channel-etching type thin film transistor. The liquid crystal displays may be designed to include a channel-protection type thin film transistor or a forward-stagger type thin film transistor. In addition, the liquid crystal displays may be designed to include a coplanar type thin film transistor in place of a stagger type thin film transistor.

Furthermore, the liquid crystal displays may be designed to include a polysilicon (p-Si) thin film transistor in place of an amorphous (a-Si) silicon thin film transistor.

The liquid crystal displays may be designed to include a metal-insulator-metal (MIM) as a switching device in place of a thin film transistor.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Applications Nos. 2002-311526 and 2003-362206 filed on Oct. 25, 2002 and Oct. 22, 2003, respectively, including specification, claims, drawings and summary is incorporated herein by reference in its entirety.

What is claimed is:

1. A method of fabricating a liquid crystal display device, comprising the steps of:
   (a) fabricating a switching device on a substrate;
   (b) forming an interlayer insulating film on said substrate such that said switching device is covered with said interlayer insulating film; and
   (c) forming a transparent electrode on said interlayer insulating film, said transparent electrode being electrically connected to said switching device through said interlayer insulating film,
   said step (c) including:
   (c1) depositing electrically conductive, transparent and amorphous material on said interlayer insulating film;
   (c2) patterning said material into said transparent electrode; and
   (c3) turning said transparent electrode into polysilicon by thermal annealing carried out after formation of an alignment film.

2. The method as set forth in claim 1, wherein said step (b) includes the steps of:
   (b1) forming an electrically insulating inorganic film on said substrate such that said switching device is covered with said electrically insulating inorganic film; and
   (b2) forming an electrically insulating organic film on said electrically insulating inorganic film.

3. The method as set forth in claim 2, wherein said electrically insulating organic film is formed covering therewith at least partially at least a signal line including a drain electrode of said switching device, in said step (b2).

4. The method as set forth in claim 1, wherein said step (a) includes the steps of:
   (a1) forming both a scanning line including a gate electrode of said switching device and a common line through which a common voltage is applied, on said substrate;
   (a2) forming a gate insulating film on said substrate such that said scanning line and said common line are covered with said gate insulating film;
   (a3) forming a semiconductor layer on said gate insulating film, said semiconductor layer acting as an active layer of said switching device; and
   (a4) forming both a signal line including a drain electrode of said switching device and a source electrode of said switching device, said signal line intersecting with said scanning line,
   and said step (c) includes the step of patterning said electrically conductive, transparent and amorphous material into a pixel electrode and a common electrode on said interlayer insulating film, said pixel electrode being in electrical connection with said switching device, said common electrode being in electrical connection with said common line.

5. The method as set forth in claim 1, wherein said material is indium-tin oxide (ITO).

6. The method as set forth in claim 1, wherein said material is deposited on said interlayer insulating film in said step (c1) at room temperature (RM).

7. The method as set forth in claim 1, wherein said material is deposited on said interlayer insulating film in said step (c1) in atmosphere including at least moisture or hydrogen.

8. The method as set forth in claim 1, wherein said thermal annealing is carried out in said step (c3) in the range of 180 to 240 degrees centigrade both inclusive.

* * * * *